(12) United States Patent
Igarashi et al.

(10) Patent No.: US 12,437,926 B2
(45) Date of Patent: Oct. 7, 2025

(54) CAPACITOR AND METHOD OF MANUFACTURING THE SAME

(71) Applicant: Sumitomo Electric Device Innovations, Inc., Yokohama (JP)

(72) Inventors: Takeshi Igarashi, Yokohama (JP); Yoshihide Komatsu, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 256 days.

(21) Appl. No.: 18/115,996

(22) Filed: Mar. 1, 2023

(65) Prior Publication Data
US 2023/0282417 A1    Sep. 7, 2023

(30) Foreign Application Priority Data
Mar. 7, 2022  (JP) ................. 2022-034090

(51) Int. Cl.
| | | |
|---|---|---|
| H01G 4/224 | (2006.01) | |
| H01G 4/008 | (2006.01) | |
| H01G 4/012 | (2006.01) | |
| H01G 4/33 | (2006.01) | |
| H01L 23/31 | (2006.01) | |
| H10D 1/68 | (2025.01) | |
| H01G 4/08 | (2006.01) | |

(Continued)

(52) U.S. Cl.
CPC ............ *H01G 4/224* (2013.01); *H01G 4/008* (2013.01); *H01G 4/012* (2013.01); *H01G 4/33* (2013.01); *H01L 23/3192* (2013.01); *H10D 1/694* (2025.01); *H10D 1/696* (2025.01); *H01G 4/085* (2013.01); *H01G 4/10* (2013.01); *H01L 23/291* (2013.01); *H01L 23/293* (2013.01)

(58) Field of Classification Search
None
See application file for complete search history.

(56) References Cited

U.S. PATENT DOCUMENTS

| | | | | |
|---|---|---|---|---|
| 5,005,103 A | * | 4/1991 | Kwon | H10D 1/66 |
| | | | | 257/E29.345 |
| 10,290,701 B1 | * | 5/2019 | Chang | H10D 1/696 |

(Continued)

FOREIGN PATENT DOCUMENTS

| | | | | |
|---|---|---|---|---|
| CN | 107799503 A | * | 3/2018 | ....... H01L 21/76846 |
| JP | 2008-300675 A | | 12/2008 | |

(Continued)

OTHER PUBLICATIONS

JP '326 Translation (Year: 2012).*

*Primary Examiner* — Dion R. Ferguson
(74) *Attorney, Agent, or Firm* — Volpe Koenig

(57) ABSTRACT

A capacitor according to an embodiment of the present disclosure includes a substrate, a first electrode disposed on the substrate, a dielectric film disposed on the first electrode, a second electrode disposed on the dielectric film, a third electrode in contact with the second electrode in a first region of at least a portion of a lower surface of the third electrode, and an organic insulator film covering an upper portion of the dielectric film, an upper portion of the second electrode, and the third electrode. In a normal direction normal to an upper surface of the substrate, the organic insulator film is not disposed between the lower surface of the third electrode and the second electrode.

8 Claims, 25 Drawing Sheets

(51) Int. Cl.
*H01G 4/10* (2006.01)
*H01L 23/29* (2006.01)

(56) References Cited

U.S. PATENT DOCUMENTS

| | | | |
|---|---|---|---|
| 10,319,634 B2 * | 6/2019 | Yamada | H01L 23/5223 |
| 11,217,395 B2 * | 1/2022 | Harada | H01G 4/33 |
| 2004/0079980 A1 * | 4/2004 | Hieda | H10D 1/696 |
| | | | 257/E27.048 |
| 2005/0056878 A1 * | 3/2005 | Shioga | H01L 21/76804 |
| | | | 257/E21.59 |
| 2008/0260967 A1 * | 10/2008 | Yoon | C23C 16/4412 |
| | | | 118/723 R |
| 2008/0296730 A1 | 12/2008 | Nakao et al. | |
| 2010/0164122 A1 | 7/2010 | Sakaki | |
| 2012/0199946 A1 * | 8/2012 | Kageyama | H01L 21/76816 |
| | | | 257/532 |
| 2018/0012954 A1 * | 1/2018 | Kurachi | H10D 1/692 |
| 2018/0061697 A1 * | 3/2018 | Yamada | H01L 21/76846 |
| 2019/0279823 A1 * | 9/2019 | Kumagae | H01G 4/306 |
| 2019/0311854 A1 * | 10/2019 | Harada | H01G 4/33 |
| 2021/0143248 A1 * | 5/2021 | Allman | H10D 1/694 |
| 2021/0226000 A1 * | 7/2021 | Nishita | H10D 1/692 |
| 2023/0282417 A1 * | 9/2023 | Igarashi | H01G 4/012 |
| | | | 361/304 |
| 2023/0282686 A1 * | 9/2023 | Yotsuda | H10D 1/684 |
| | | | 438/381 |
| 2024/0162375 A1 * | 5/2024 | Cho | H10H 20/857 |

FOREIGN PATENT DOCUMENTS

| | | | |
|---|---|---|---|
| JP | 2010-157552 A | | 7/2010 |
| JP | 2012015326 A | * | 1/2012 |
| JP | 2018-006620 A | | 1/2018 |
| JP | 2022130066 A | * | 9/2022 |
| WO | WO-2023080088 A1 | * | 5/2023 ............ H01L 23/12 |

* cited by examiner

CAPACITOR AND METHOD OF MANUFACTURING THE SAME

CROSS REFERENCE TO RELATED APPLICATIONS

This application claims priority based on Japanese Patent Application No. 2022-034090 filed on Mar. 7, 2022, and the entire contents of the Japanese patent application are incorporated herein by reference.

TECHNICAL FIELD

The present invention relates to a capacitor and a method of manufacturing the same.

BACKGROUND ART

There is known a capacitor in which a first electrode, a dielectric film, and a second electrode are stacked over a substrate. It is known to form a third electrode used as a wiring on a second electrode (for example, PTL 1).
[PTL 1] Japanese Unexamined Patent Application Publication No. 2018-006620

SUMMARY OF INVENTION

A capacitor according to an embodiment of the present disclosure includes a substrate, a first electrode disposed on the substrate, a dielectric film disposed on the first electrode, a second electrode disposed on the dielectric film, a third electrode in contact with the second electrode in a first region of at least a portion of a lower surface of the third electrode, and an organic insulator film covering an upper portion of the dielectric film, an upper portion of the second electrode, and the third electrode. In a normal direction normal to an upper surface of the substrate, the organic insulator film is not disposed between the lower surface of the third electrode and the second electrode.

A method of manufacturing a capacitor according to an embodiment of the present disclosure includes forming a first electrode on a substrate, forming a dielectric film on the first electrode, forming a second electrode on the dielectric film, forming, on the second electrode, a first mask layer having a first opening, forming a seed layer on an inner surface of the first opening and on the first mask layer, forming, on the seed layer, a second mask layer that has a second opening included in the first opening and having an opening area smaller than an opening area of the first opening in plan view, forming a plating layer in the second opening, removing the second mask layer, removing the seed layer using the plating layer as a mask to form a third electrode including the seed layer and the plating layer, and forming an organic insulator film on the substrate so as to cover the third electrode.

DESCRIPTION OF EMBODIMENTS

Figure 1:
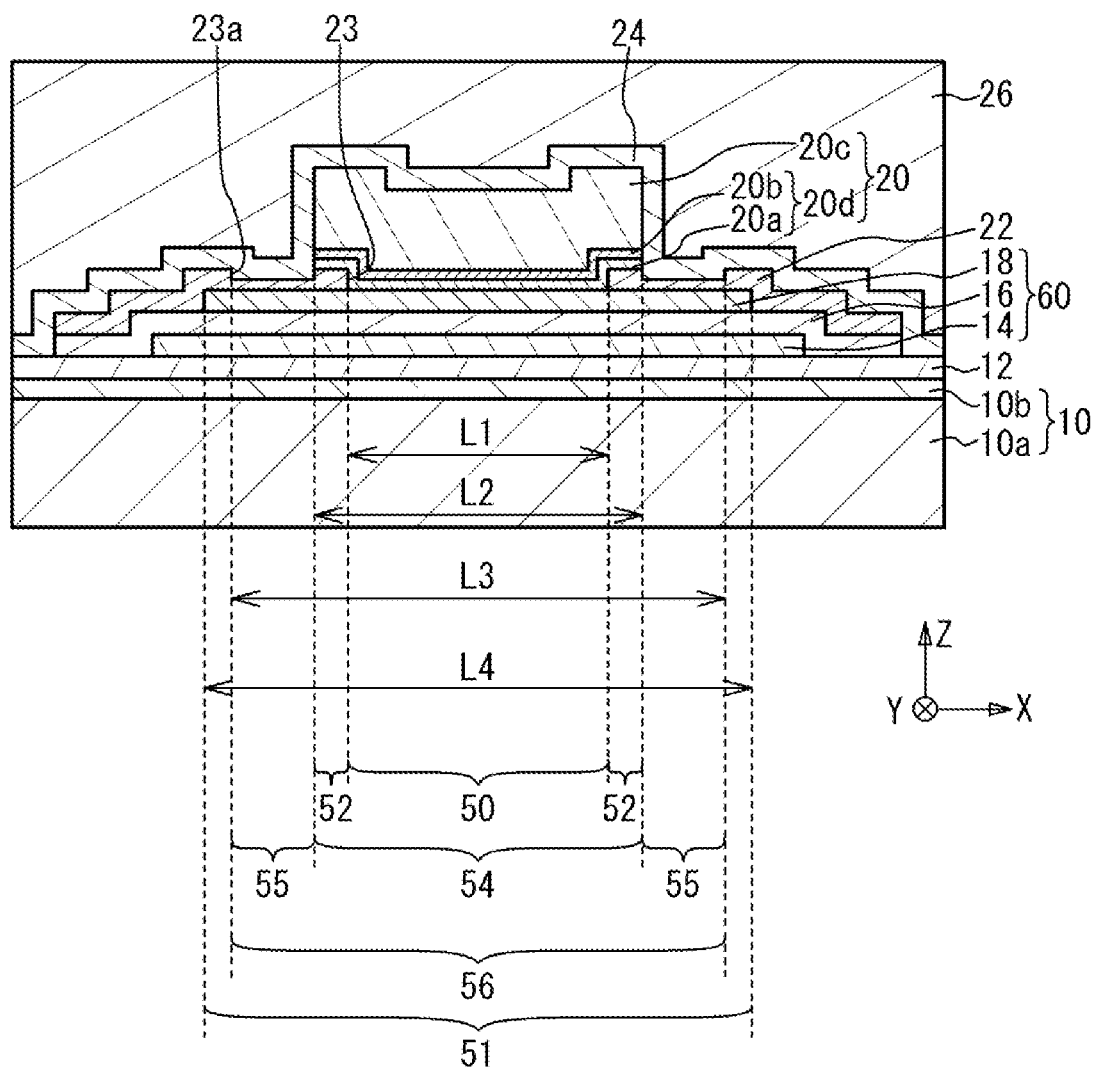
FIG. 1 is a cross-sectional view of a capacitor according to a first embodiment.

When the organic insulator film is formed so as to cover the capacitor, the third electrode in PTL 1 may be peeled off or the withstand voltage of the capacitor may be lowered due to stress of the organic insulator film.

The present disclosure has been made in view of the above problems, and an object of the present disclosure is to suppress deterioration of electrical characteristics of a capacitor.

Description of Embodiments of Present Disclosure

First, the contents of embodiments of the present disclosure will be listed and explained.

(1) A capacitor according to an embodiment of the present disclosure includes a substrate, a first electrode disposed on the substrate, a dielectric film disposed on the first electrode, a second electrode disposed on the dielectric film, a third electrode in contact with the second electrode in a first region of at least a portion of a lower surface of the third electrode, and an organic insulator film covering an upper portion of the dielectric film, an upper portion of the second electrode, and the third electrode. In a normal direction normal to an upper surface of the substrate, the organic insulator film is not disposed between the lower surface of the third electrode and the second electrode. Since the organic insulator film is not disposed between the lower surface of the third electrode and the second electrode, it is possible to suppress deterioration of electrical characteristics of the capacitor due to stress of the organic insulator film.

(2) In the above (1), the capacitor may include an inorganic insulator film disposed on the second electrode and having an opening in the first region. The first region of the lower surface of the third electrode may be in contact with the second electrode through the opening, and a second region of the lower surface of the third electrode, the second region surrounding the first region, may be in contact with the inorganic insulator film outside the opening.

(3) In the above (2), the third electrode may include a seed layer disposed on the second electrode and a plating layer disposed on the seed layer.

(4) In the above (3), a recess may be provided in a third region of an upper surface of the inorganic insulator film, the third region surrounding the third electrode.

(5) In any one of (1) to (4) above, in the normal direction, the organic insulator film may be not disposed between a portion of the lower surface of the third electrode, the portion being parallel to the upper surface of the substrate, and the second electrode.

(6) In any one of (1) to (5) above, the third electrode may include a first layer disposed on the second electrode and a second layer disposed on the first layer and having a resistivity lower than a resistivity of the first layer. In the normal direction, the organic insulator film may be not disposed between the first layer and the second electrode.

(7) A method of manufacturing a capacitor according to an embodiment of the present disclosure includes forming a first electrode on a substrate, forming a dielectric film on the first electrode, forming a second electrode on the dielectric film, forming, on the second electrode, a first mask layer having a first opening, forming a seed layer on an inner surface of the first opening and on the first mask layer, forming, on the seed layer, a second mask layer that has a second opening included in the first opening and having an opening area smaller than an opening area of the first opening in plan view, forming a plating layer in the second opening, removing the second mask layer, removing the seed layer using the plating layer as a mask to form a third electrode including the seed layer and the plating layer, and forming an organic insulator film on the substrate so as to cover the third electrode. As a result, deterioration of electrical characteristics of the capacitor can be suppressed.

(8) In the above (7), the forming the organic insulator film may include forming the organic insulator film such that the organic insulator film is not formed between a lower surface of the third electrode and the second electrode in a normal direction normal to an upper surface of the substrate.

(9) In the above (7) or (8), the method of manufacturing a capacitor may include, before the forming the first mask layer, forming, on the second electrode, an inorganic insulator film having a third opening. The forming the second mask layer may include forming the second mask layer that has the second opening including the third opening and having an opening area with a size equal to or larger than an opening area of the third opening in plan view.

Details of Embodiments of Present Disclosure

Specific examples of a capacitor and a method of manufacturing the same according to embodiments of the present disclosure will be described below with reference to the drawings. The present disclosure is not limited to these examples, and is defined by the scope of the claims, and is intended to include all modifications within the meaning and scope equivalent to the scope of the claims.

First Embodiment

Figure 2:
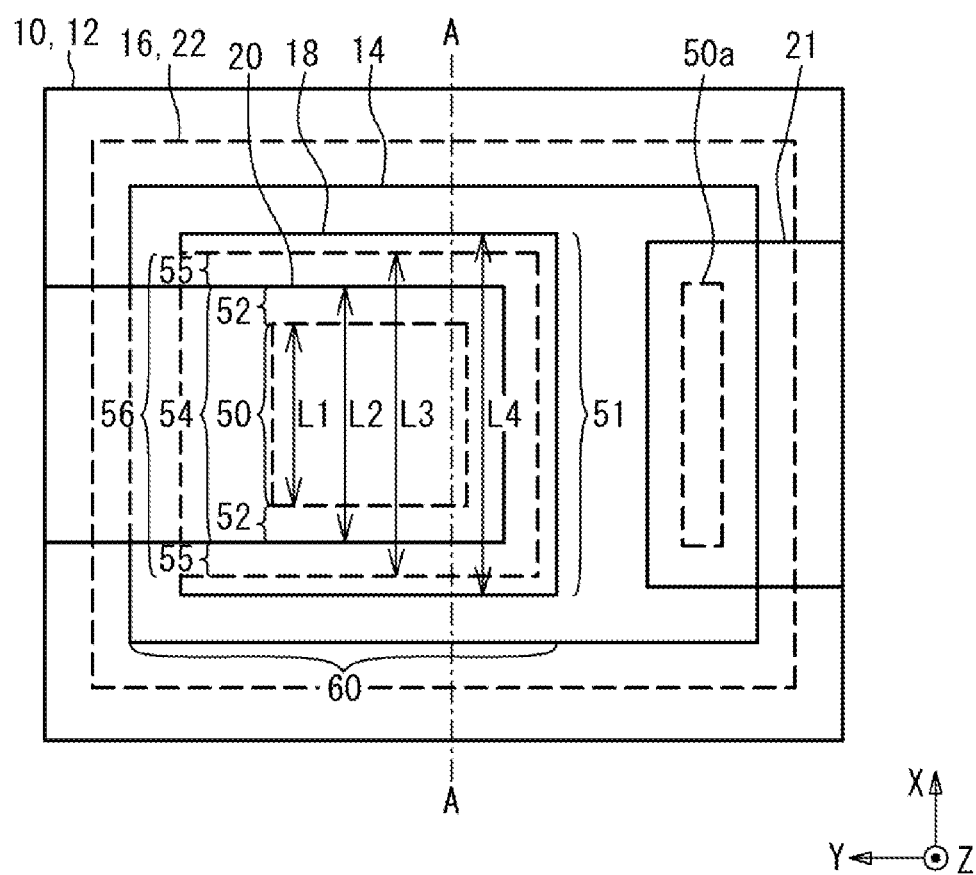
FIG. 2 is a plan view of the capacitor according to the first embodiment.

FIG. 1 is a cross-sectional view of a capacitor according to a first embodiment. FIG. 2 is a plan view of the capacitor according to the first embodiment. FIG. 1 is a cross-sectional view taken along line A-A of FIG. 2. In FIG. 2, a first electrode 14, a second electrode 18, a third electrode 20 and a region 50 are mainly illustrated. A normal direction on the upper surface of a substrate 10 is defined as a Z direction, and directions parallel to the upper surface of substrate 10 are defined as an X direction and a Y direction.

As illustrated in FIG. 1, substrate 10 includes a substrate 10a and a semiconductor layer 10b disposed on substrate 10a. Semiconductor layer 10b is, for example, a GaN-based semiconductor layer or a GaAs-based semiconductor layer. When semiconductor layer 10b is a GaN-based semiconductor layer, substrate 10a is, for example, a SiC substrate, a sapphire substrate, a silicon substrate, or a GaN substrate, and semiconductor layer 10b includes a layer made of GaN, AlN, InN, or a mixed crystal thereof. When semiconductor layer 10b is a GaAs-based semiconductor layer, substrate 10a is, for example, a GaAs substrate, and semiconductor layer 10b includes a layer made of GaAs, AlAs, InAs, or a mixed crystal thereof. Semiconductor layer 10b in the region where the capacitor is disposed is inactivated by ion implantation or the like. A transistor using semiconductor layer 10b may be disposed on substrate 10, and the capacitor and the transistor may be integrated on same substrate 10 to form a monolithic microwave integrated circuit (MMIC). Semiconductor layer 10b may not be disposed on substrate 10, and an active element such as a transistor may not be disposed on substrate 10.

An insulator film 12 is disposed on substrate 10. Insulator film 12 is, for example, an inorganic insulator film such as a silicon nitride film, a silicon oxide film, or a silicon nitride oxide film, or an organic insulator film such as polyimide or a benzocyclobutene (BCB) resin. The thickness of insulator film 12 is, for example, 100 nm to 1200 nm. First electrode 14 is disposed on insulator film 12 on substrate 10. A dielectric film 16 is disposed on first electrode 14. Second electrode 18 is disposed on dielectric film 16. A metal insulator metal (MIM) capacitor 60 includes first electrode 14, dielectric film 16, and second electrode 18.

A distance between first electrode 14 and second electrode 18 through dielectric film 16 is substantially uniform to the extent of a manufacturing error. In a plan view seen from above in the Z direction (the normal direction of the upper surface of substrate 10), the outer periphery of first electrode 14 is located outside the outer periphery of second electrode 18. The outer periphery of dielectric film 16 is located outside the outer periphery of first electrode 14. First electrode 14 and second electrode 18 are, for example, metal films including an adhesion film and a low-resistance film disposed on the adhesion film. The adhesion film is, for example, a Ti film, a WSi film, a TiW film, a TiWN film, or a TiN film. The low-resistance film is made of a material having resistivity lower than that of the adhesion film and is, for example, an Au film. The thicknesses of the adhesive films are, for example, 3 nm to 300 nm. The adhesion film may not be disposed. The thicknesses of the low-resistance film is, for example, 50 nm to 400 nm. Dielectric film 16 is an inorganic insulator film such as a silicon nitride film, a silicon oxide film, or a silicon nitride oxide film. From a point of view raising a dielectric constant, dielectric film 16 may be a silicon nitride film. The thicknesses of dielectric film 16 is, for example, 50 nm to 400 nm. The thickness of dielectric film 16 is set in consideration of the capacitance value, the withstand voltage, and the like of MIM capacitor 60.

An inorganic insulator film 22 is disposed so as to cover second electrode 18. Inorganic insulator film 22 is, for example, a silicon nitride film, a silicon oxide film, or a silicon nitride oxide film, and from a point of view protecting MIM capacitor 60, inorganic insulator film 22 may be a silicon nitride film. The thickness of inorganic insulator film 22 is, for example, 50 nm to 400 nm. In region 50, an opening 23 is provided in inorganic insulator film 22. Third electrode 20 is disposed on second electrode 18. In region 50 corresponding to the central region of the lower surface of third electrode 20, the lower surface of third electrode 20 is in contact with second electrode 18 through opening 23. In a region 52 outside region 50, the lower surface of third electrode 20 is in contact with inorganic insulator film 22. A region 54 is a combination of regions 50 and 52. A region 56 wider than region 54 is provided. A recess 23a is formed on the upper surface of inorganic insulator film 22 in a region 55 other than third electrode 20 in region 56. Second electrode 18 is disposed in a region 51.

Third electrode 20 includes a seed layer 20d disposed over second electrode 18 and a plating layer 20c disposed on seed layer 20d. Seed layer 20d is, for example, a metal layer including an adhesive layer 20a and a low-resistance layer 20b disposed on adhesive layer 20a. Adhesive layer 20a is, for example, a Ti film, a WSi film, a TiW film, a TiWN film, or a TiN film. Low-resistance layer 20b is made of a material having a resistivity lower than that of adhesive layer 20a and is, for example, an Au film. The thickness of adhesive layer 20a is, for example, 3 nm to 400 nm. Adhesive layer 20a may not be disposed. The thickness of low-resistance layer 20b is, for example, 50 nm to 200 nm. Plating layer 20c is a metal film made of the same material as low-resistance layer 20b, and is, for example, an Au film. The thickness of plating layer 20c is, for example, 1 μm to 6 μm.

An inorganic insulator film 24 is disposed so as to cover inorganic insulator film 22 and third electrode 20. Inorganic insulator film 24 is, for example, a silicon nitride film, a silicon oxide film, or a silicon nitride oxide film. From a point of view the protection function, a silicon nitride film may be used as inorganic insulator film 24. The thickness of inorganic insulator film 24 is, for example, 30 nm to 800 nm. Inorganic insulator film 24 may not be disposed. An organic insulator film 26 is disposed so as to cover inorganic insulator film 24. Organic insulator film 26 is a resin film made of, for example, polyimide or BCB resin. The thickness of organic insulator film 26 is, for example, 1 μm to 10 μm.

As illustrated in FIG. 2, first electrode 14 is disposed larger on the −Y side than the region where MIM capacitor 60 is disposed. On the negative side in the Y direction of MIM capacitor 60, an electrode 21 is disposed on the upper surface of first electrode 14. Electrode 21 is in contact with first electrode 14 in a region 50a. Electrode 21 includes same seed layer 20d and plating layer 20c as those third electrode 20 includes, and is formed simultaneously with third electrode 20. Third electrode 20 in contact with second electrode 18 is disposed larger on the positive side in the Y direction than the region in which MIM capacitor 60 is disposed. Third electrode 20 functions as a wiring electrically connected to second electrode 18, and electrode 21 functions as a wiring electrically connected to first electrode 14.

The widths of regions 50, 54 and 56 are defined as L1, L2 and L3, respectively. When the width of second electrode 18 is defined as L4, width L3 are smaller than width L4, width L2 are equal to or smaller than width L3, and width L1 are equal to or smaller than width L2. Width L2 may be smaller than width L3 and width L1 may be smaller than width L2. As illustrated in FIG. 2, when the planar size of first electrode 14 viewed from the positive side to the negative side in the Z direction is larger than the planar size of second electrode 18, width L4 of second electrode 18 is designed based on the target capacitance value of MIM capacitor 60, and is, for example, 10 μm to 1 mm. Width L1 of region 50 is smaller than width L4 by 1 μm to 10 μm, for example. Width L2 of region 54 is larger than width L1, for example, by 0 μm to 5 μm. Width L3 of region 56 is larger than width L2, for example, by 0 μm to 5 μm.

Method of Manufacturing of First Embodiment

Figure 3A:
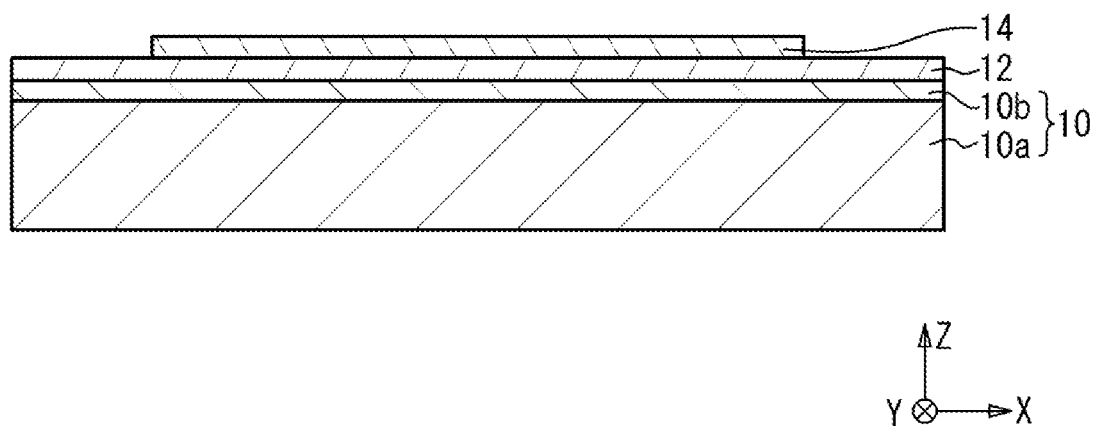
FIG. 3A is a cross-sectional view illustrating a method of manufacturing the capacitor according to the first embodiment.
Figure 3B:
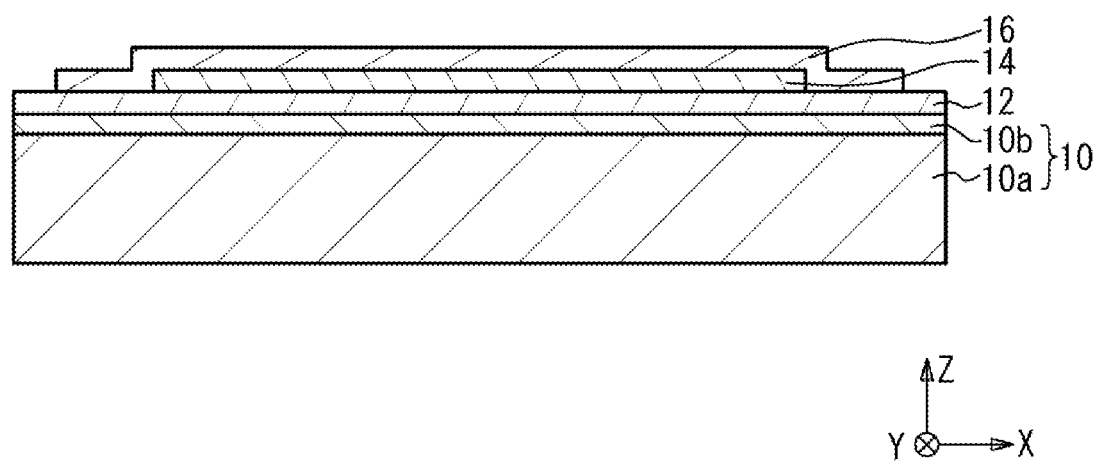
FIG. 3B is a cross-sectional view illustrating the method of manufacturing the capacitor according to the first embodiment.

FIG. 3A to FIG. 10B are cross-sectional views illustrating method of manufacturing a capacitor according to a first embodiment. As illustrated in FIG. 3A, insulator film 12 is formed on substrate 10. First electrode 14 is formed on insulator film 12. First electrode 14 is formed using a sputtering method or a vacuum evaporation method and patterned into a desired shape using an etching method or a lift-off method. As illustrated in FIG. 3B, dielectric film 16 is formed on insulator film 12 so as to cover first electrode 14. Dielectric film 16 is formed using, for example, a CVD (Chemical Vapor Deposition) method.

Figure 4A:
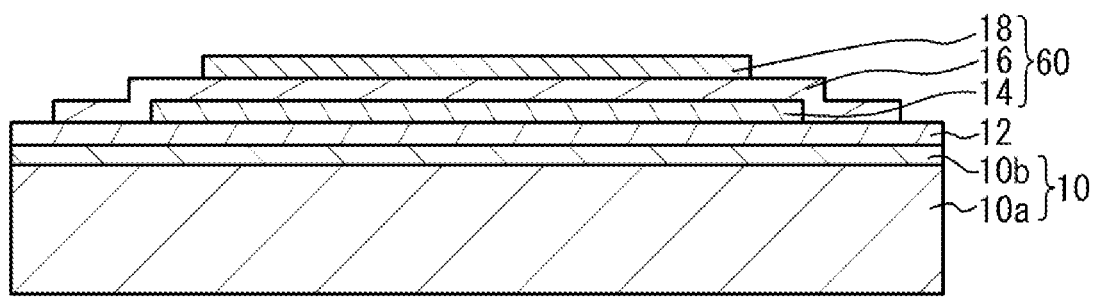
FIG. 4A is a cross-sectional view illustrating the method of manufacturing the capacitor according to the first embodiment.
Figure 4A:
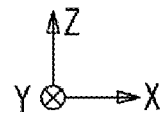
Figure 4B:
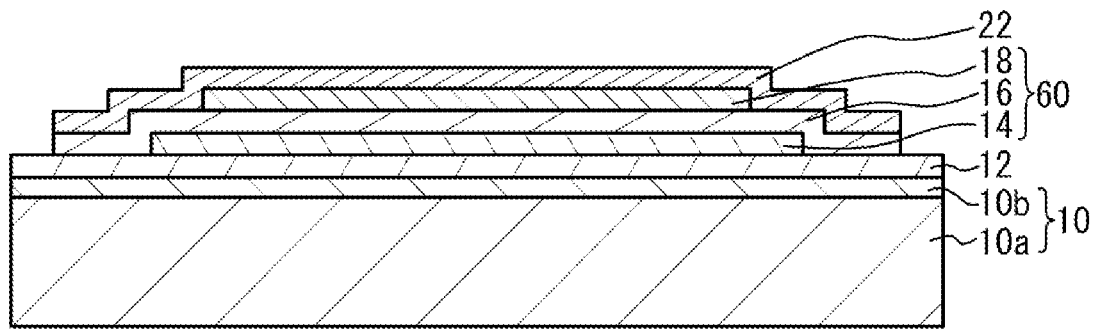
FIG. 4B is a cross-sectional view illustrating the method of manufacturing the capacitor according to the first embodiment.
Figure 4B:
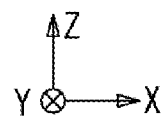

As illustrated in FIG. 4A, second electrode 18 is formed on dielectric film 16. Second electrode 18 is formed using, for example, a vacuum evaporation method and a lift-off method. MIM capacitor 60 including first electrode 14, dielectric film 16, and second electrode 18 is formed. As illustrated in FIG. 4B, inorganic insulator film 22 is formed so as to cover dielectric film 16 and second electrode 18. Inorganic insulator film 22 is formed using, for example, a CVD method. Dielectric film 16 and inorganic insulator film 22 are patterned into a desired shape using an etching method.

Figure 5A:
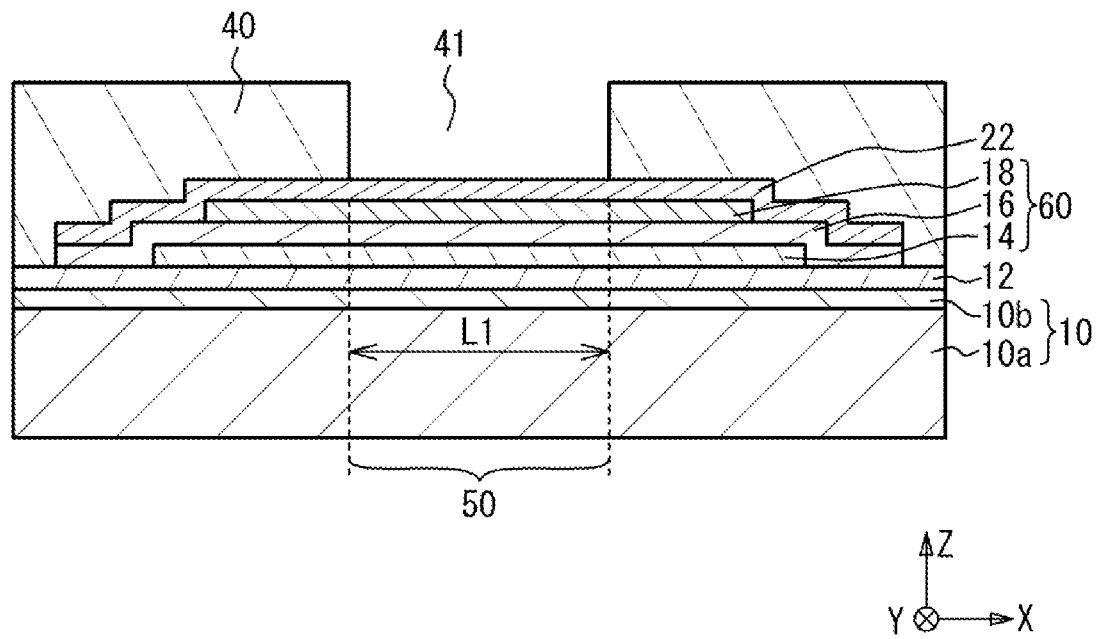
FIG. 5A is a cross-sectional view illustrating the method of manufacturing the capacitor according to the first embodiment.
Figure 5B:
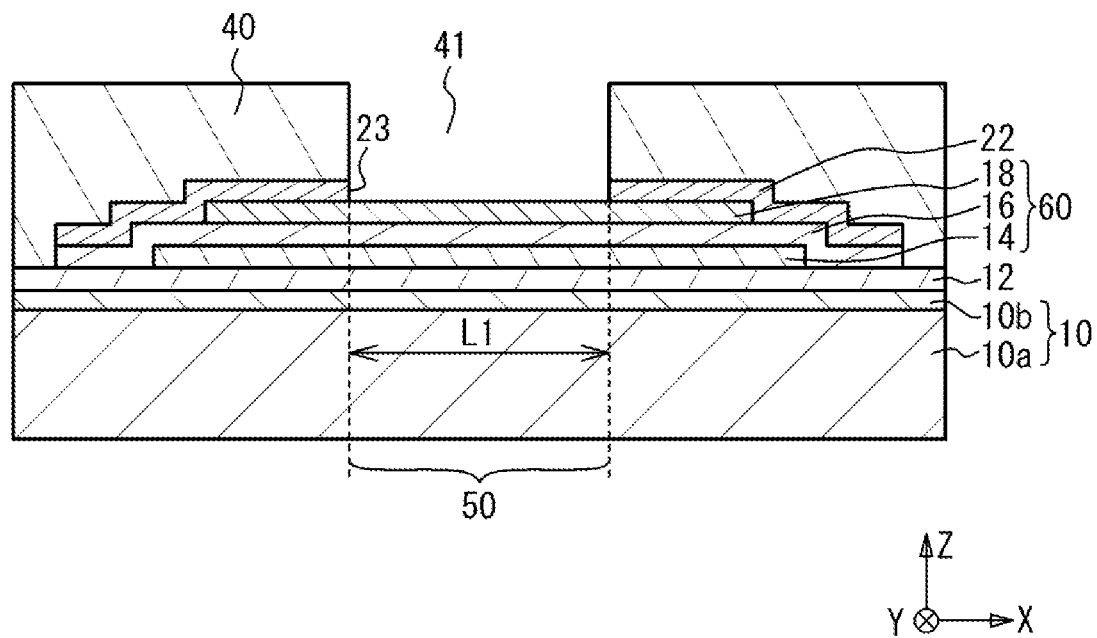
FIG. 5B is a cross-sectional view illustrating the method of manufacturing the capacitor according to the first embodiment.

As illustrated in FIG. 5A, a mask layer 40 having an opening 41 is formed on inorganic insulator film 22. Mask layer 40 is, for example, a photoresist and is formed using a photolithography method. Opening 41 is provided in region 50, and the width of opening 41 along the X direction is L1. As illustrated in FIG. 5B, inorganic insulator film 22 is removed by an etching method using mask layer 40 as a mask. Thus, opening 23 is formed in inorganic insulator film 22. Opening 23 is provided in region 50, and the width of opening 23 along the X direction is L1.

Figure 6A:
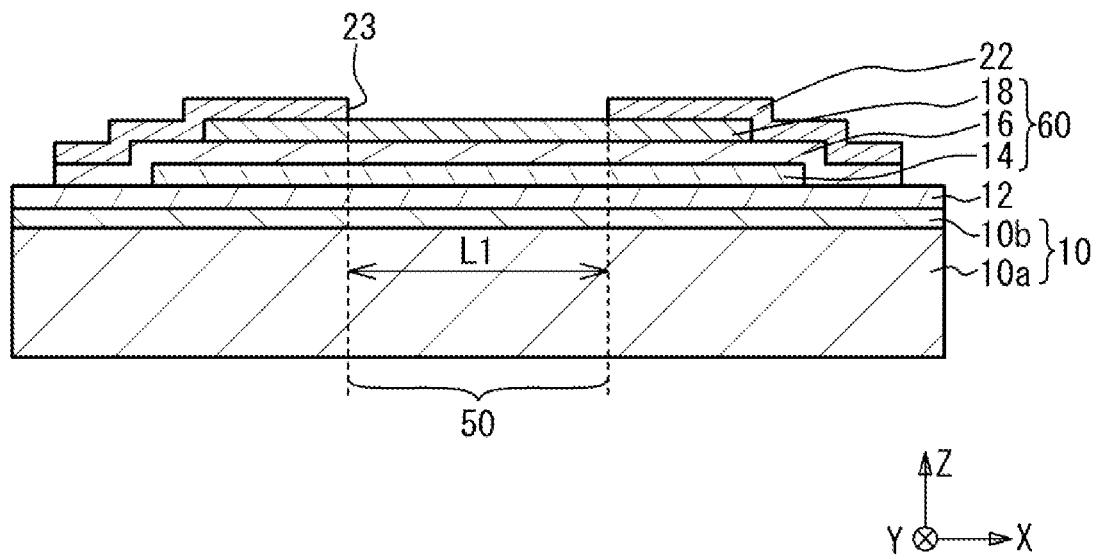
FIG. 6A is a cross-sectional view illustrating the method of manufacturing the capacitor according to the first embodiment.
Figure 6B:
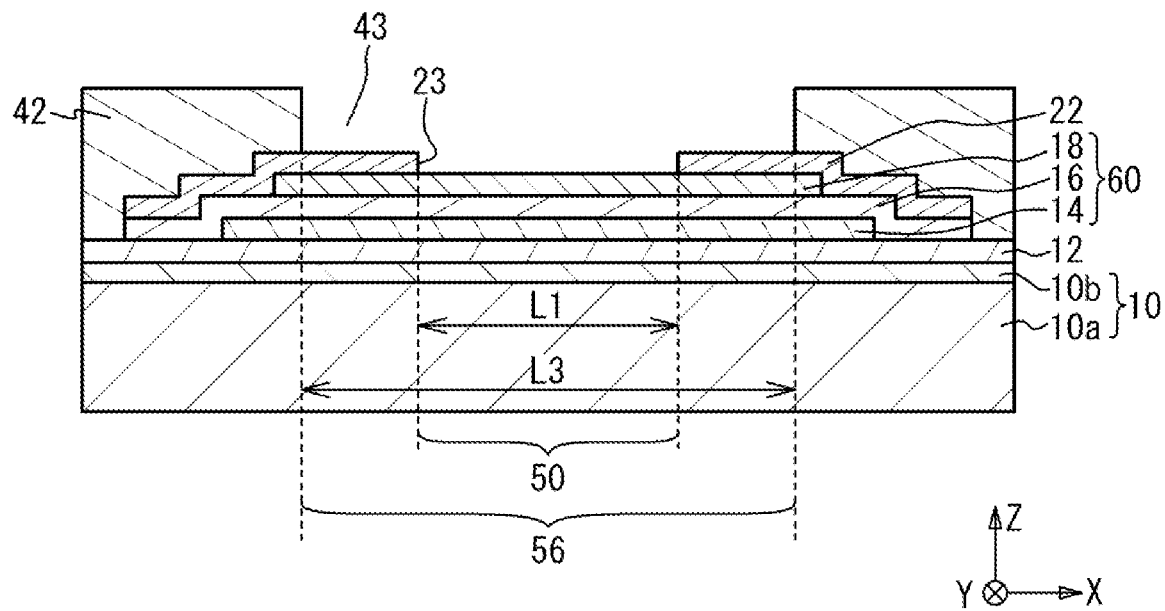
FIG. 6B is a cross-sectional view illustrating the method of manufacturing the capacitor according to the first embodiment.

As illustrated in FIG. 6A, mask layer 40 is removed. As illustrated in FIG. 6B, a mask layer 42 having an opening 43 is formed on inorganic insulator film 22. Mask layer 42 is, for example, a photoresist and is formed using a photolithography method. Opening 43 is provided in region 56, and the width of opening 43 along the X direction is L3. Opening 43 is formed to include opening 23 and is larger than opening 23.

Figure 7A:
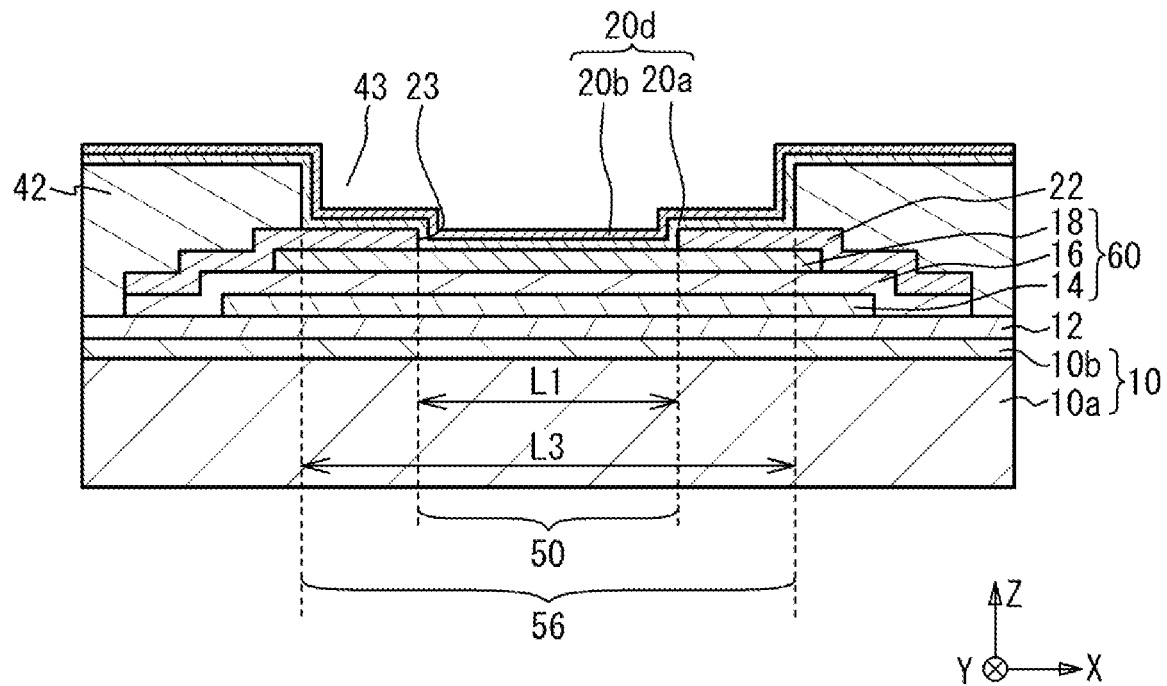
FIG. 7A is a cross-sectional view illustrating the method of manufacturing the capacitor according to the first embodiment.
Figure 7B:
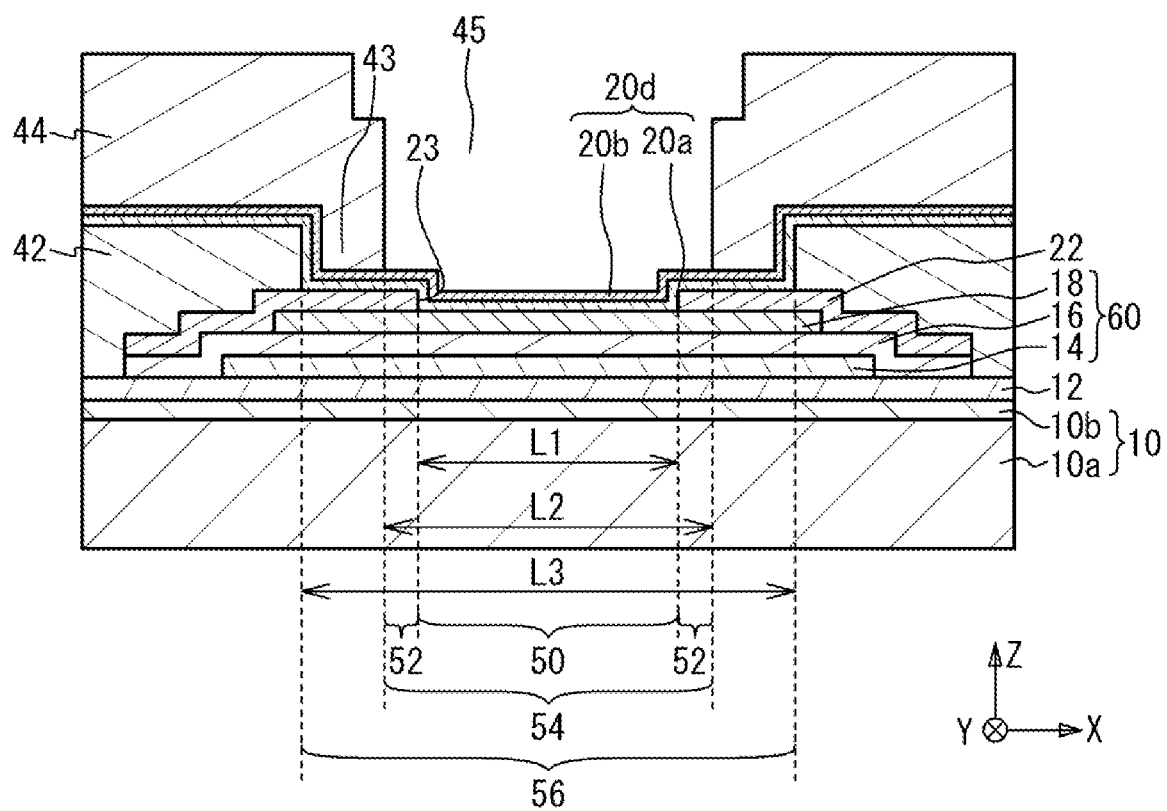
FIG. 7B is a cross-sectional view illustrating the method of manufacturing the capacitor according to the first embodiment.

As illustrated in FIG. 7A, seed layer 20d is formed on the inner surface of opening 43 and mask layer 42. Seed layer 20d is formed using a sputtering method, for example. In region 50, seed layer 20d is in contact with the upper surface of second electrode 18. In region 56 other than region 50, seed layer 20d is in contact with the upper surface of inorganic insulator film 22. As illustrated in FIG. 7B, a mask layer 44 having an opening 45 is formed on seed layer 20d. Mask layer 44 is, for example, a photoresist and is formed using a photolithography method. Opening 45 is provided in region 54, and the width of opening 45 along the X direction is L2. Opening 45 is formed to include opening 23, and is formed to be included in opening 43. Opening 45 is larger than opening 23 and smaller than opening 43. In region 52 surrounding region 50, seed layer 20d is in contact with inorganic insulator film 22.

Figure 8A:
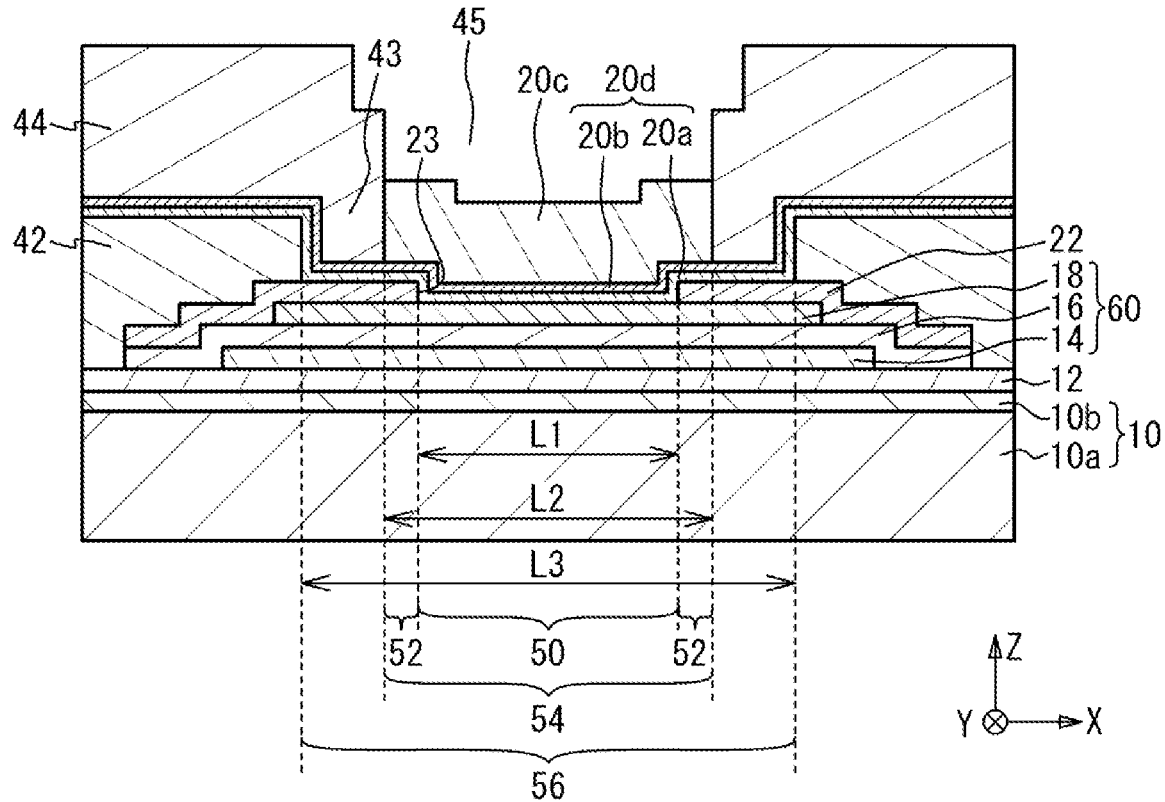
FIG. 8A is a cross-sectional view illustrating the method of manufacturing the capacitor according to the first embodiment.
Figure 8B:
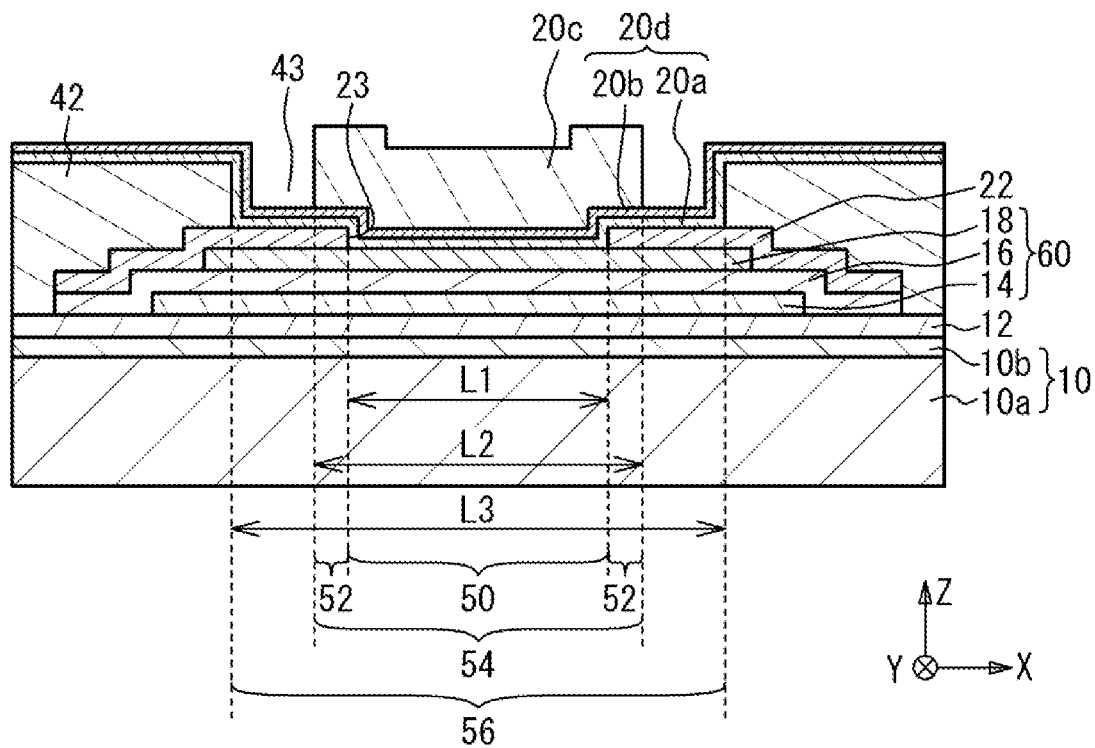
FIG. 8B is a cross-sectional view illustrating the method of manufacturing the capacitor according to the first embodiment.

As illustrated in FIG. 8A, plating layer 20c is formed in opening 45. Plating layer 20c is formed using, for example, an electrolytic plating method in which a current is supplied from seed layer 20d. Plating layer 20c is formed in region 54. As illustrated in FIG. 8B, mask layer 44 is removed.

Figure 9A:
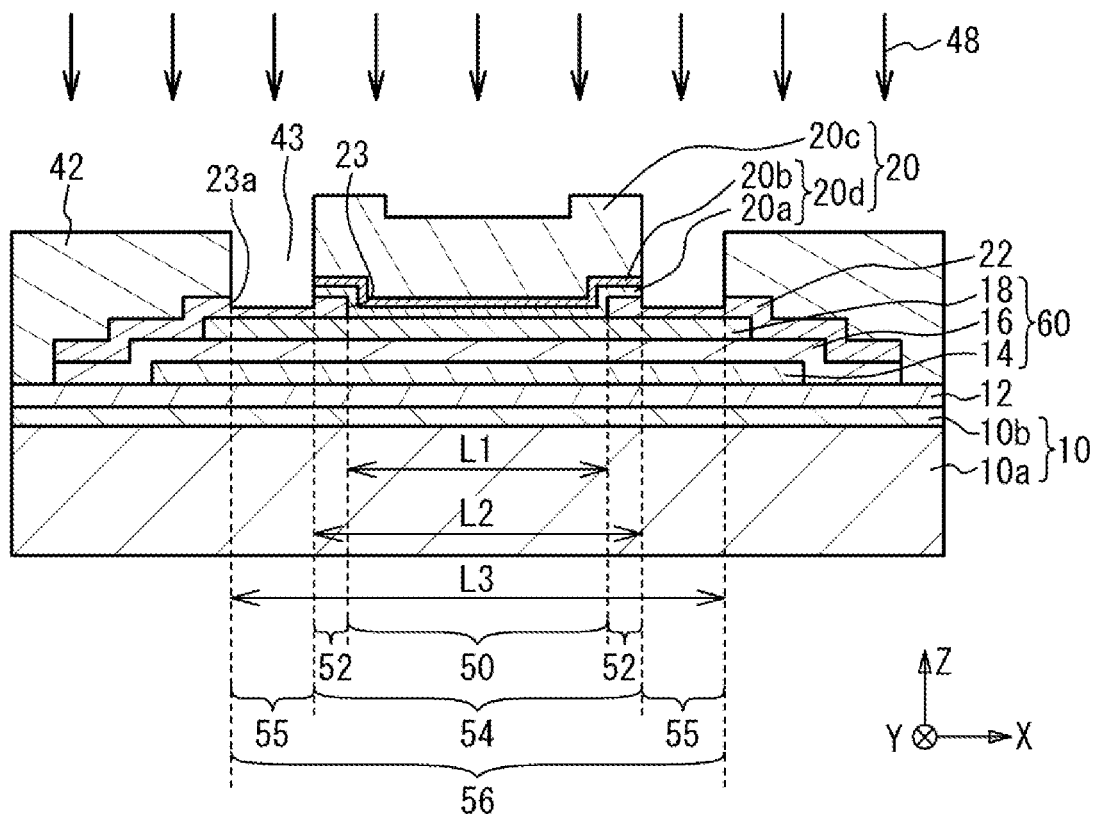
FIG. 9A is a cross-sectional view illustrating the method of manufacturing the capacitor according to the first embodiment.
Figure 9B:
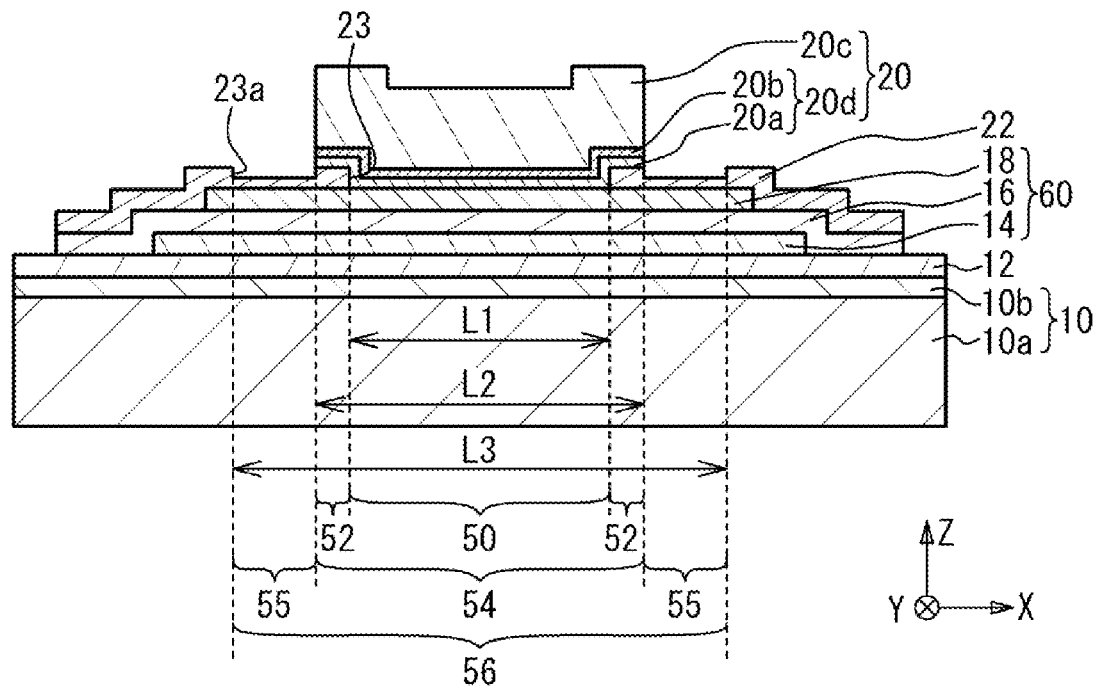
FIG. 9B is a cross-sectional view illustrating the method of manufacturing the capacitor according to the first embodiment.

As illustrated in FIG. 9A, seed layer 20d is removed using plating layer 20c as a mask. Seed layer 20d is removed using an etching method such as an ion milling method in which seed layer 20d is irradiated with ions 48 such as argon ions. As a result, seed layer 20d formed in regions other than region 54 is removed, and third electrode 20 including seed layer 20d and plating layer 20c is formed. Third electrode 20 is in contact with inorganic insulator film 22 in region 52 other than region 50 in region 54. Recess 23a is formed on the upper surface of inorganic insulator film 22 in region 55 other than region 54 in region 56. Recess 23a is formed by etching the upper surface of inorganic insulator film 22 when seed layer 20d is removed. As illustrated in FIG. 9B, mask layer 42 is removed.

Figure 10A:
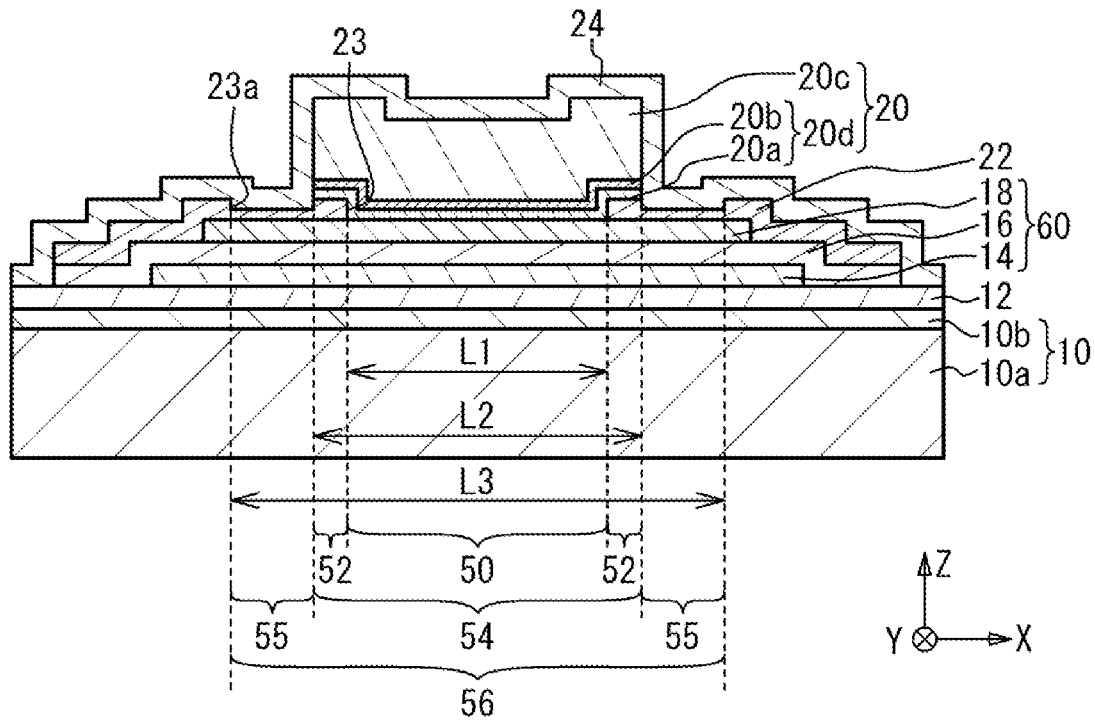
FIG. 10A is a cross-sectional view illustrating the method of manufacturing the capacitor according to the first embodiment.
Figure 10B:
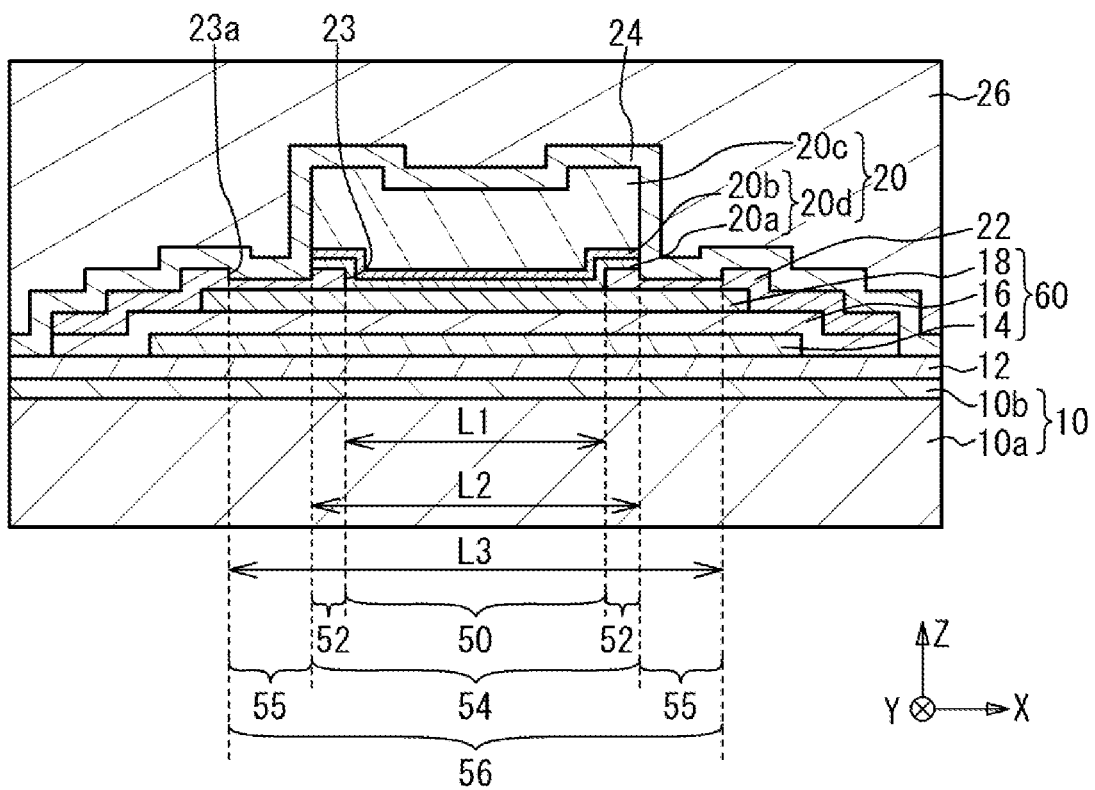
FIG. 10B is a cross-sectional view illustrating the method of manufacturing the capacitor according to the first embodiment.

As illustrated in FIG. 10A, inorganic insulator film 24 is formed on substrate 10 so as to cover inorganic insulator film 22 and third electrode 20. Inorganic insulator film 24 is formed using, for example, a CVD method. As illustrated in FIG. 10B, organic insulator film 26 is formed on inorganic insulator film 24. Organic insulator film 26 is formed using applying a resin containing an organic solvent and performing a heat treatment. The heat treatment is performed at a temperature of, for example, 250° C. to 350° C. Thus, the resin is cured and organic insulator film 26 is formed. As described above, the capacitor according to the first embodiment is manufactured.

In the first embodiment, region 54 is larger than region 50, and region 56 is larger than region 54. Thus, the lower surface of third electrode 20 is in contact with second electrode 18 in region 50 and is in contact with inorganic insulator film 22 in region 52. Organic insulator film 26 is not disposed between second electrode 18 and the lower surface of third electrode 20 represented by region 50 or width L1 along the X direction.

Comparative Example 1

Figure 11A:
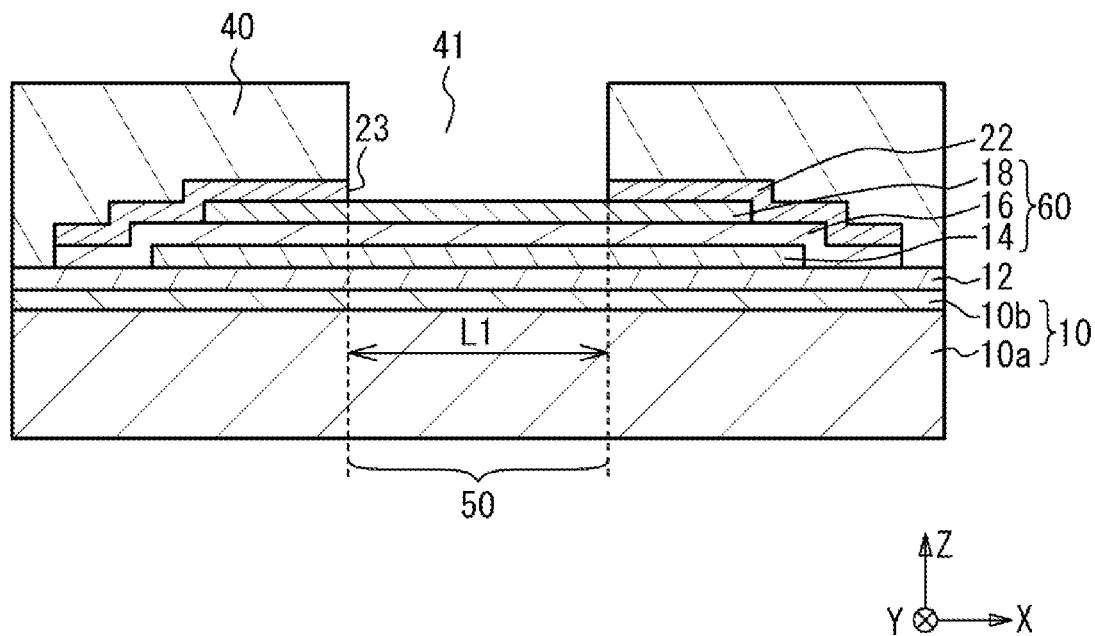
FIG. 11A is a cross-sectional view illustrating a method of manufacturing a capacitor according to comparative example 1.

FIG. 11A to FIG. 13B are cross-sectional views illustrating a method of manufacturing a capacitor according to comparative example 1. As illustrated in FIG. 11A, the same steps as in FIGS. 3A to 5B of the first embodiment are carried out. Opening 23 defined by opening 41 of mask layer 40 is formed in inorganic insulator film 22. Opening 23 is provided in region 50, and the width of opening 23 is L1 along the X direction. As illustrated in FIG. 11B, mask layer 42 having opening 43 is formed on inorganic insulator film 22 and over second electrode 18. Opening 43 is larger than opening 23. Opening 43 is provided in region 54, and the width of opening 43 is L3 along the X direction.

Figure 12A:
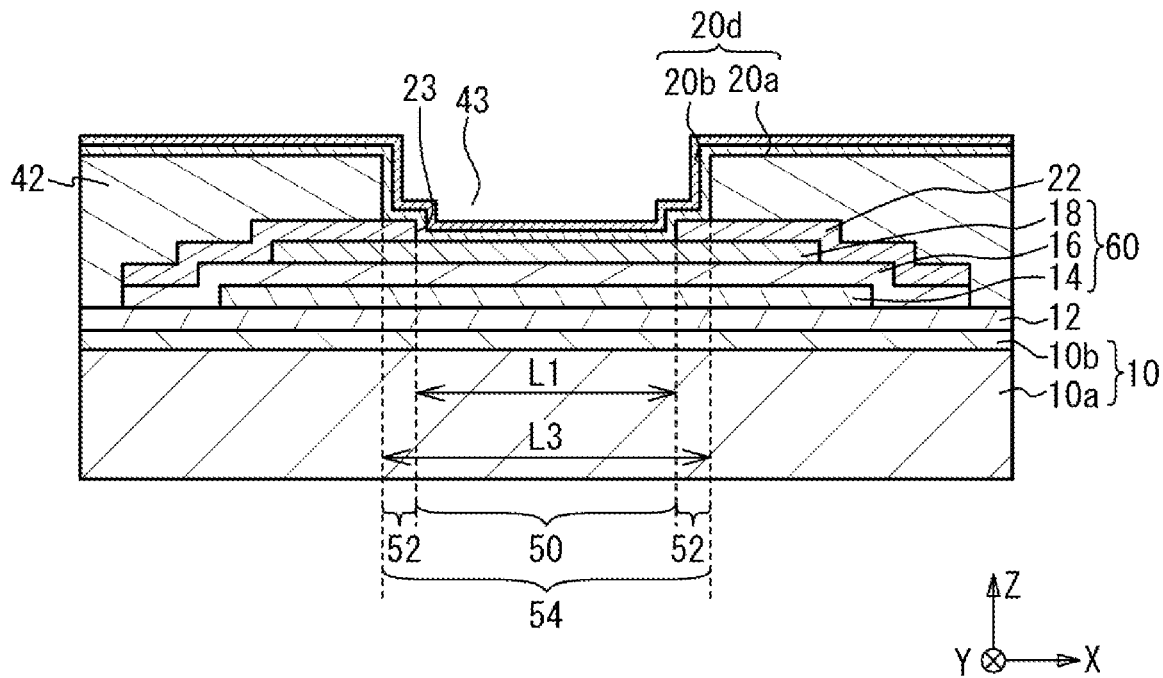
FIG. 12A is a cross-sectional view illustrating the method of manufacturing the capacitor according to comparative example 1.
Figure 12B:
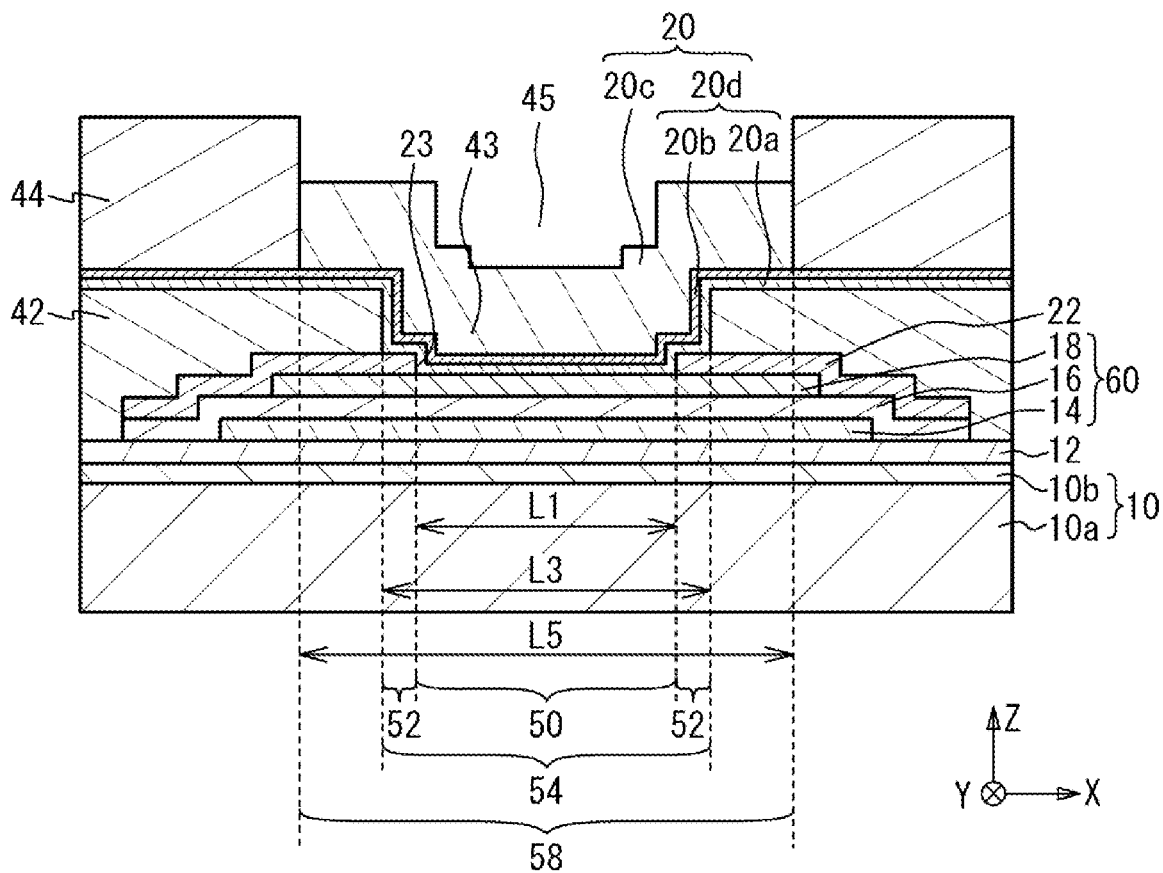
FIG. 12B is a cross-sectional view illustrating the method of manufacturing the capacitor according to comparative example 1.

As illustrated in FIG. 12A, seed layer 20d is formed on the inner surface of opening 43 and mask layer 42. As illustrated in FIG. 12B, mask layer 44 having opening 45 is formed. Opening 45 is larger than opening 43. Opening 45 is provided in a region 58, and the width of opening 45 is L5 along the X direction. Plating layer 20c is formed in opening 45.

Figure 13A:
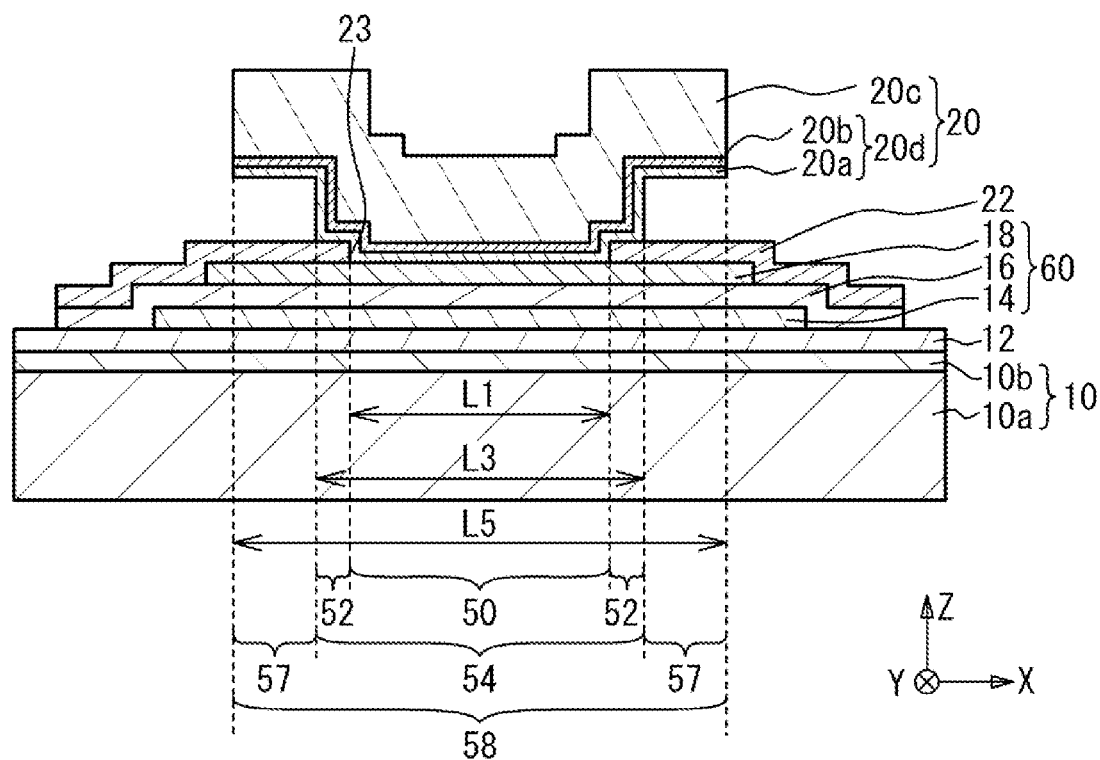
FIG. 13A is a cross-sectional view illustrating the method of manufacturing the capacitor according to comparative example 1.
Figure 13B:
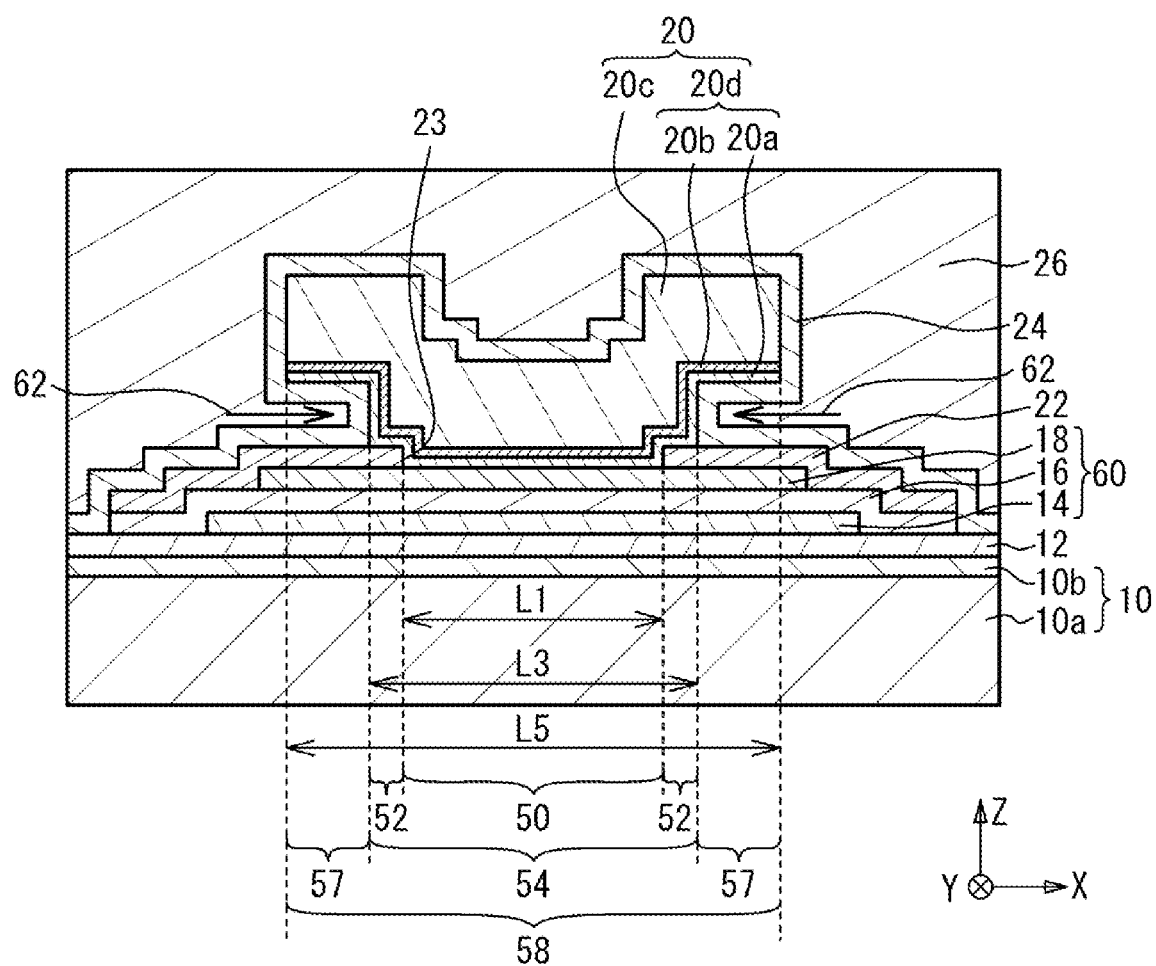
FIG. 13B is a cross-sectional view illustrating the method of manufacturing the capacitor according to comparative example 1.

As illustrated in FIG. 13A, mask layer 44 is removed. Seed layer 20d is removed using plating layer 20c as a mask. Mask layer 42 is removed. An overhang of third electrode 20 is formed in a region 57 other than region 54 in region 58. As illustrated in FIG. 13B, inorganic insulator film 24 is formed so as to cover inorganic insulator film 22 and third electrode 20. Organic insulator film 26 is formed on inorganic insulator film 24. Inorganic insulator film 24 and organic insulator film 26 are also formed between the lower surface of the overhang of third electrode 20 and second electrode 18 in region 57. As described above, the capacitor according to comparative example 1 can be manufactured.

Figure 11B:
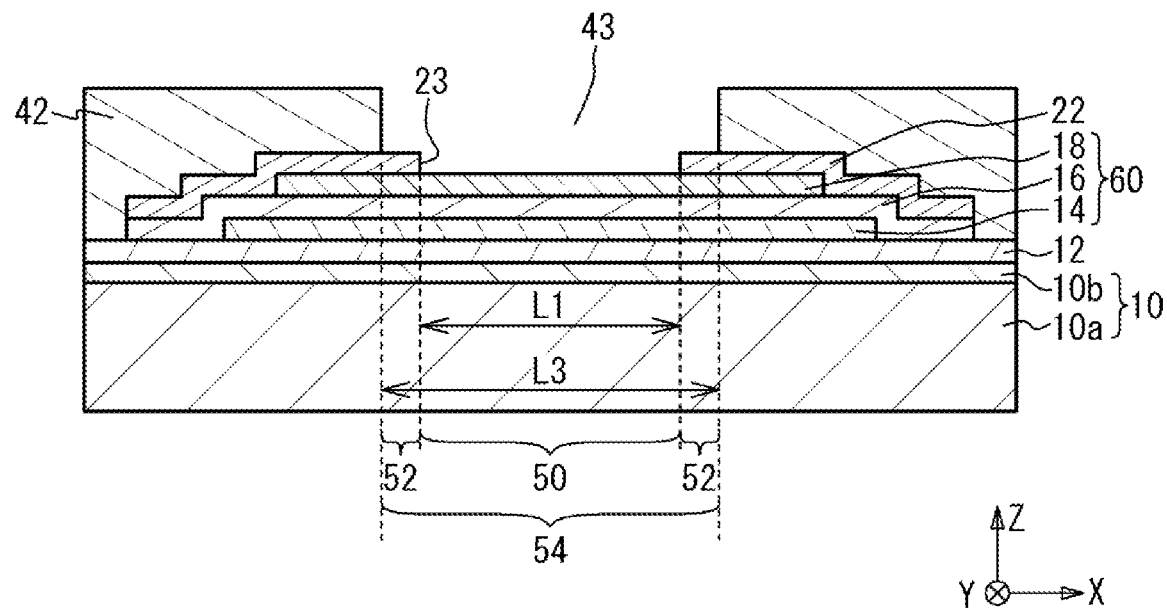
FIG. 11B is a cross-sectional view illustrating the method of manufacturing the capacitor according to comparative example 1.

In comparative example 1, after mask layer 42 having opening 43 is formed as illustrated in FIG. 11B, seed layer 20d is formed as illustrated in FIG. 12A. This is because when seed layer 20d is formed without forming mask layer 42, seed layer 20d remaining in the level difference on the upper surface of inorganic insulator film 22 is peeled off after seed layer 20d is removed, thereby causing a defect. Details will be described in modification 3 of the first embodiment. As illustrated in FIG. 12B, mask layer 44 having opening 45 larger than opening 43 is formed, and plating layer 20c is formed in opening 45. As illustrated in FIG. 13A, seed layer 20d is removed using plating layer 20c as a mask. Since the upper surface of mask layer 42 is relatively flat, a level difference is not formed and seed layer 20d does not remain. Even if a level difference is formed on the upper surface of mask layer 42 and seed layer 20d remains, remaining seed layer 20d can be removed by removing mask layer 42.

However, width L5 of region 58 are larger than width L3 of region 54. Therefore, as illustrated in FIG. 13B, the overhang of third electrode 20 is formed in region 57. Organic insulator film 26 has a larger stress than inorganic insulator film 22. In addition, inorganic insulator film 22 is sufficiently thinner than the height of the overhang of third electrode 20, and the thickness of organic insulator film 26 along the Z direction in region 57 below the overhang of third electrode 20 is often larger than the total thickness of inorganic insulator film 22. Therefore, as indicated by an arrow in FIG. 13B, a stress 62 of organic insulator film 26 between third electrode 20 and second electrode 18 in region 57 is applied to third electrode 20 along the X direction. In particular, when organic insulator film 26 is heat-treated, organic insulator film 26 shrinks and stress 62 increases. As a result, third electrode 20 may be peeled off from second electrode 18. In addition, due to stress 62, there is a possibility that the withstand voltage of MIM capacitor 60 decreases or the electrical characteristics of MIM capacitor 60 deteriorate due to its use.

Comparative Example 2

Figure 14A:
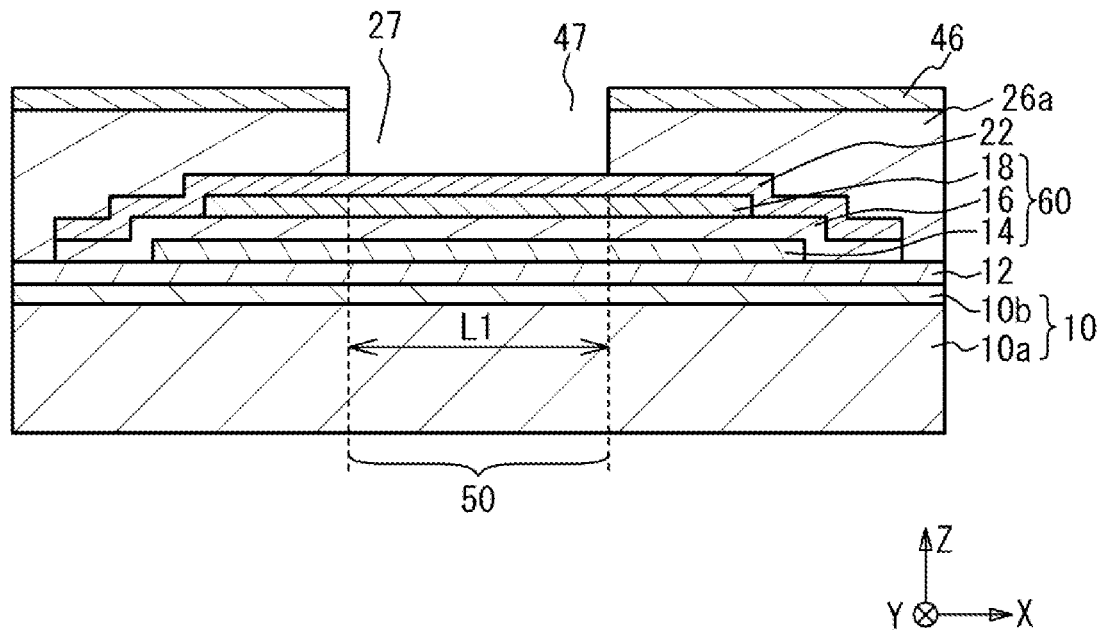
FIG. 14A is a cross-sectional view illustrating a method of manufacturing a capacitor according to comparative example 2.
Figure 14B:
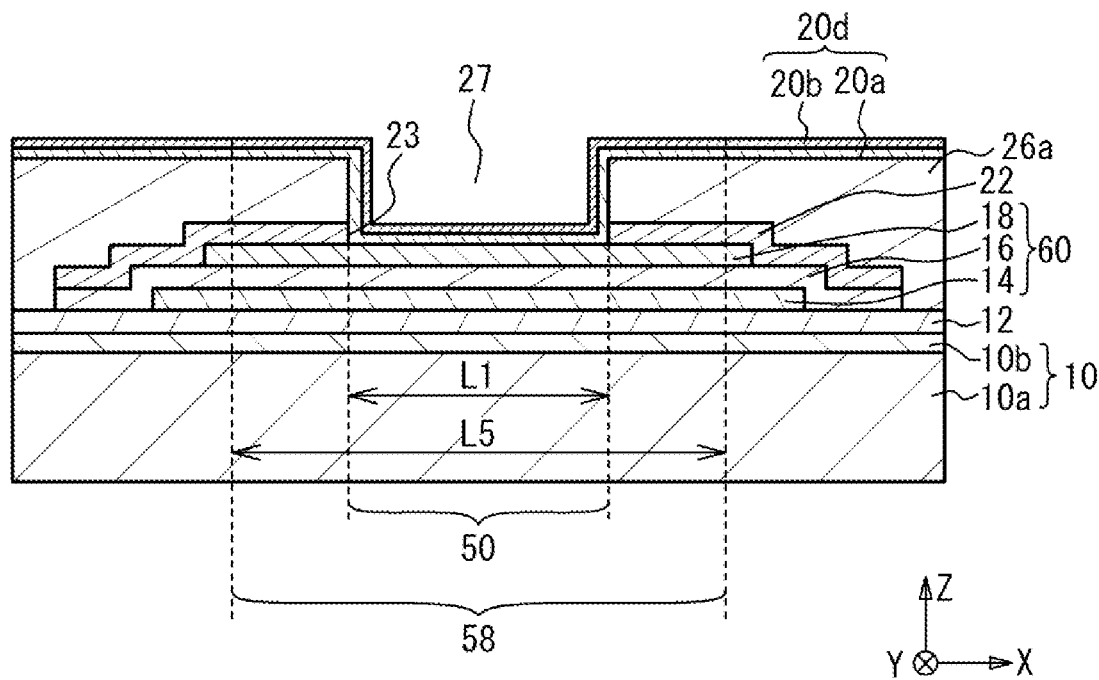
FIG. 14B is a cross-sectional view illustrating the method of manufacturing the capacitor according to comparative example 2.

FIG. 14A to FIG. 16 are cross-sectional views illustrating a method of manufacturing a capacitor according to comparative example 2. As illustrated in FIG. 14A, an organic insulator film 26a is formed on inorganic insulator film 22. A mask layer 46 having an opening 47 is formed on organic insulator film 26a. Mask layer 46 is, for example, an inorganic insulator film such as a silicon nitride film. Using mask layer 46 as a mask, an opening 27 is formed in organic insulator film 26a. As illustrated in FIG. 14B, opening 23 is formed in inorganic insulator film 22 using organic insulator film 26a as a mask. Seed layer 20d is formed on the inner surfaces of openings 27 and 23 and organic insulator film 26a.

Figure 15A:
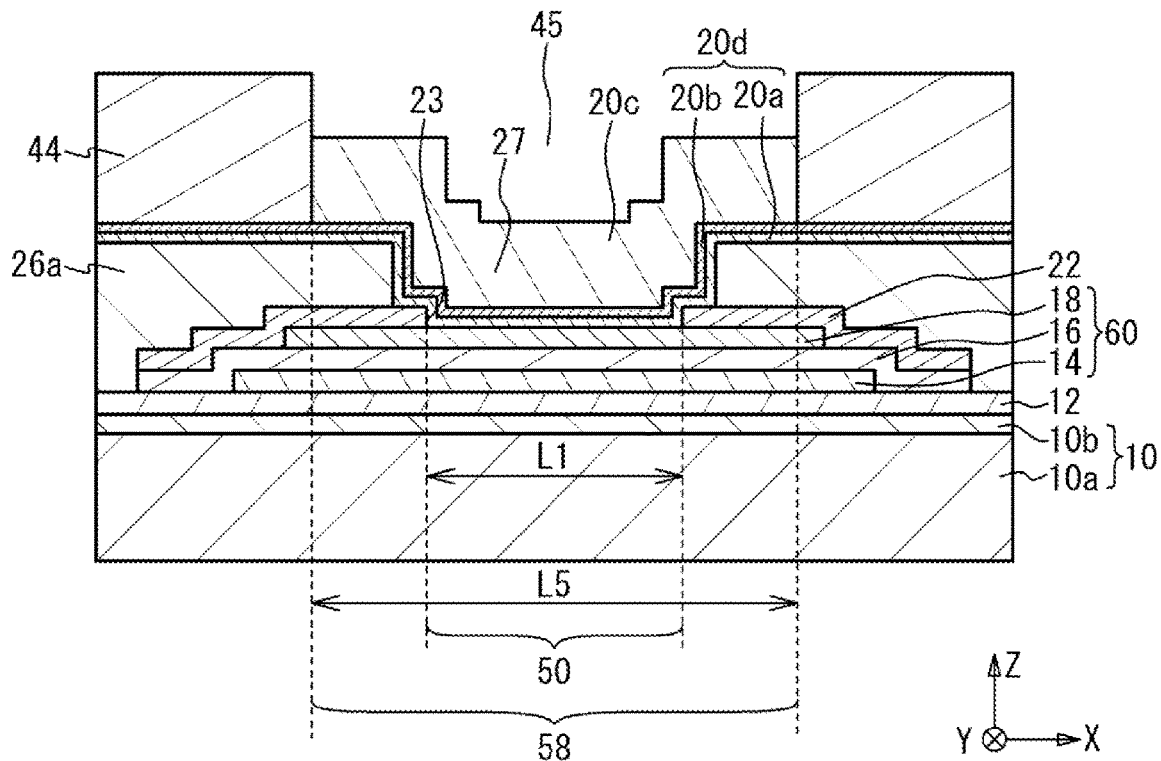
FIG. 15A is a cross-sectional view illustrating the method of manufacturing the capacitor according to comparative example 2.
Figure 15B:
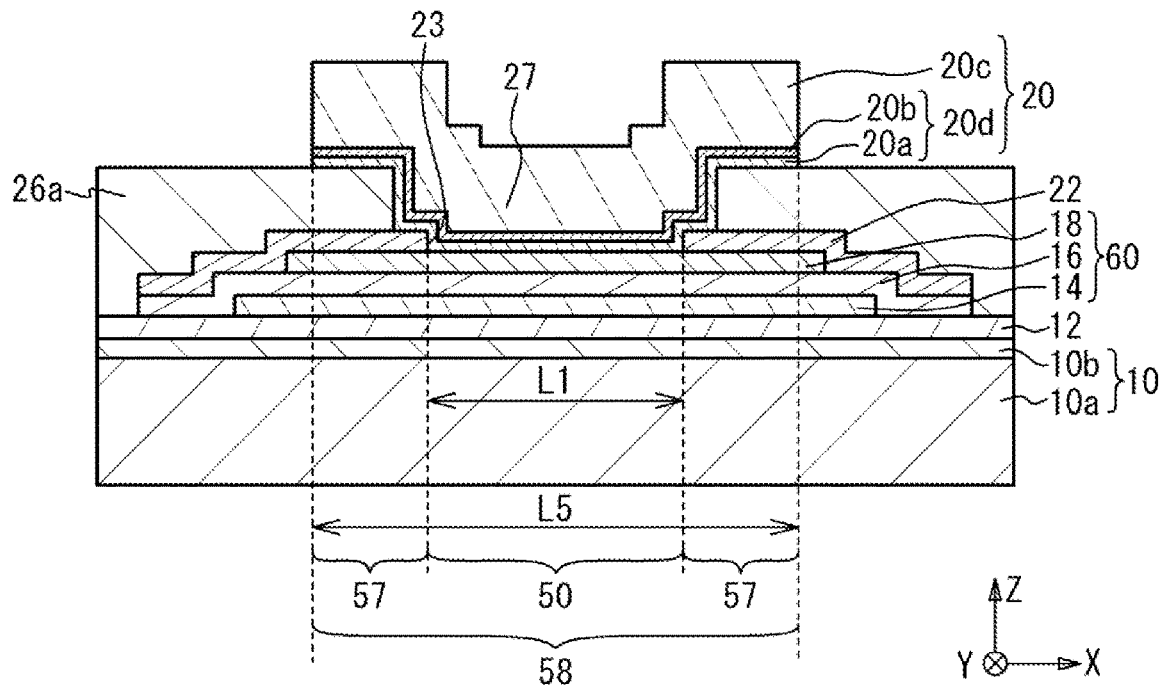
FIG. 15B is a cross-sectional view illustrating the method of manufacturing the capacitor according to comparative example 2.

As illustrated in FIG. 15A, mask layer 44 having opening 45 is formed on seed layer 20d. Opening 45 is provided in region 58, and the width of opening 45 along the X direction is L5. Plating layer 20c is formed in opening 45. As illustrated in FIG. 15B, mask layer 44 is removed and seed layer 20d is removed using plating layer 20c as a mask. The overhang of third electrode 20 is formed in region 57 other than region 50 in region 58.

Figure 16:
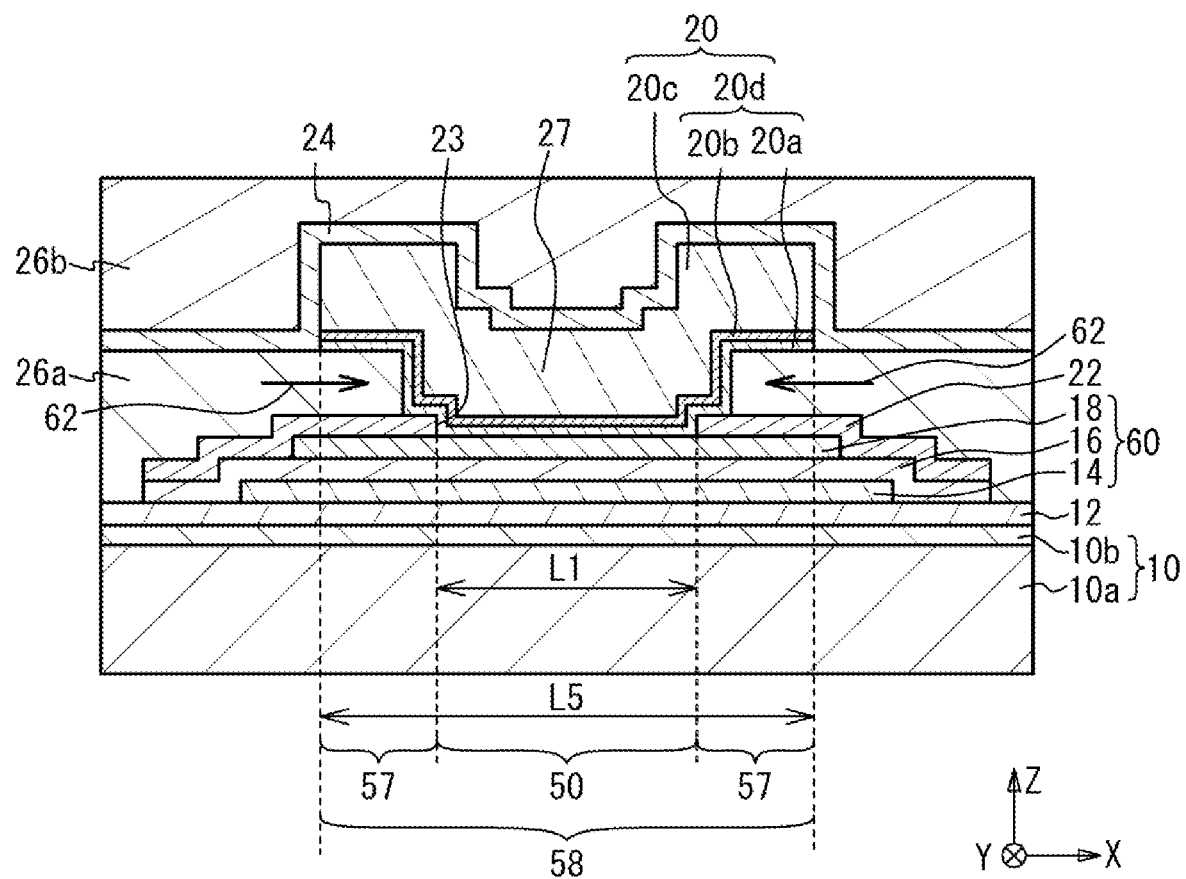
FIG. 16 is a cross-sectional view illustrating the method of manufacturing the capacitor according to comparative example 2.

As illustrated in FIG. 16, inorganic insulator film 24 is formed so as to cover organic insulator film 26a and third electrode 20. An organic insulator film 26b is formed on inorganic insulator film 24. As described above, the capacitor according to comparative example 2 can be manufactured.

Also in comparative example 2, in region 57, organic insulator film 26a is formed between the lower surface of third electrode 20 and second electrode 18 in the Z direction. As indicated by arrow, stress 62 of organic insulator film 26 between third electrode 20 and second electrode 18 is applied to third electrode 20 along the X direction. As a result, third electrode 20 may be peeled off from second electrode 18. In addition, there is a possibility that the withstand voltage of MIM capacitor 60 decreases or the electrical characteristics of MIM capacitor 60 deteriorate due to its use.

According to the first embodiment, as illustrated in FIG. 1, the lowermost surface of third electrode 20 in the negative side along the Z direction is in contact with second electrode 18 in region 50. Organic insulator film 26 is formed to cover an upper portion of dielectric film 16, an upper portion of second electrode 18 and third electrode 20. However, organic insulator film 26 is not disposed between the lower surface of third electrode 20 and second electrode 18 in the Z direction (the normal direction of the upper surface of substrate 10), including region 50 and region 52 around region 50. That is, organic insulator film 26 is not disposed vertically below (on the negative side along the Z direction) the lower surface of third electrode 20. As a result, it is possible to prevent third electrode 20 from being peeled off due to stress 62 caused by organic insulator film 26 disposed under the overhang of third electrode 20 as comparative examples 1 and 2 in FIG. 13B and FIG. 16. In addition, it is possible to suppress a decrease in the withstand voltage of MIM capacitor 60 or deterioration in electrical characteristics due to use. Thus, it is possible to suppress the deterioration of the electrical characteristics of the capacitor caused by stress 62 of organic insulator film 26.

Modification 1 of First Embodiment

Figure 17:
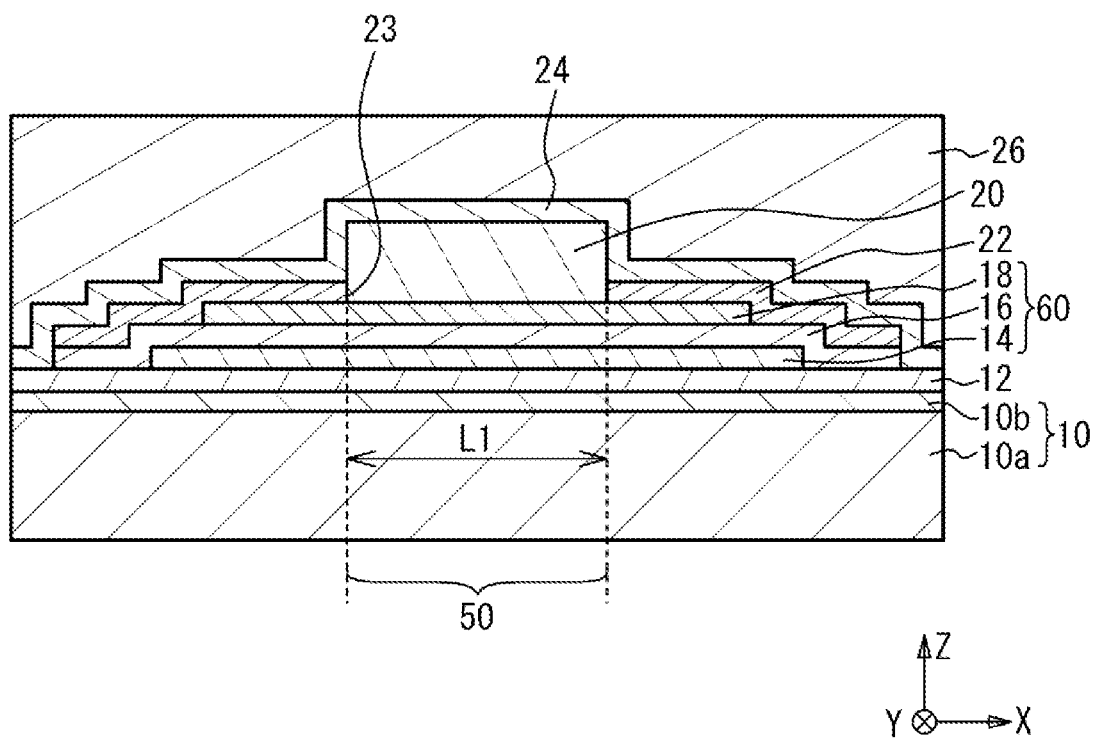
FIG. 17 is a cross-sectional view illustrating a capacitor according to modification 1 of the first embodiment.

FIG. 17 is a cross-sectional view of a capacitor according to modification 1 of the first embodiment. As illustrated in FIG. 17, third electrode 20 is disposed in opening 23 of inorganic insulator film 22. The lower surface of third electrode 20 is entirely in contact with second electrode 18, and is not in contact with the upper surface of inorganic insulator film 22. Second electrode 18 can be formed using, for example, an electroless plating method or a vacuum evaporation method. Other configurations are the same as those of the first embodiment, and a description thereof is omitted. As in modification 1 of the first embodiment, the entire lower surface of third electrode 20 may be in contact with second electrode 18. As described above, at least a part of region 50 of the lower surface of third electrode 20 may be in contact with the upper surface of second electrode 18.

Modification 2 of First Embodiment

Figure 18:
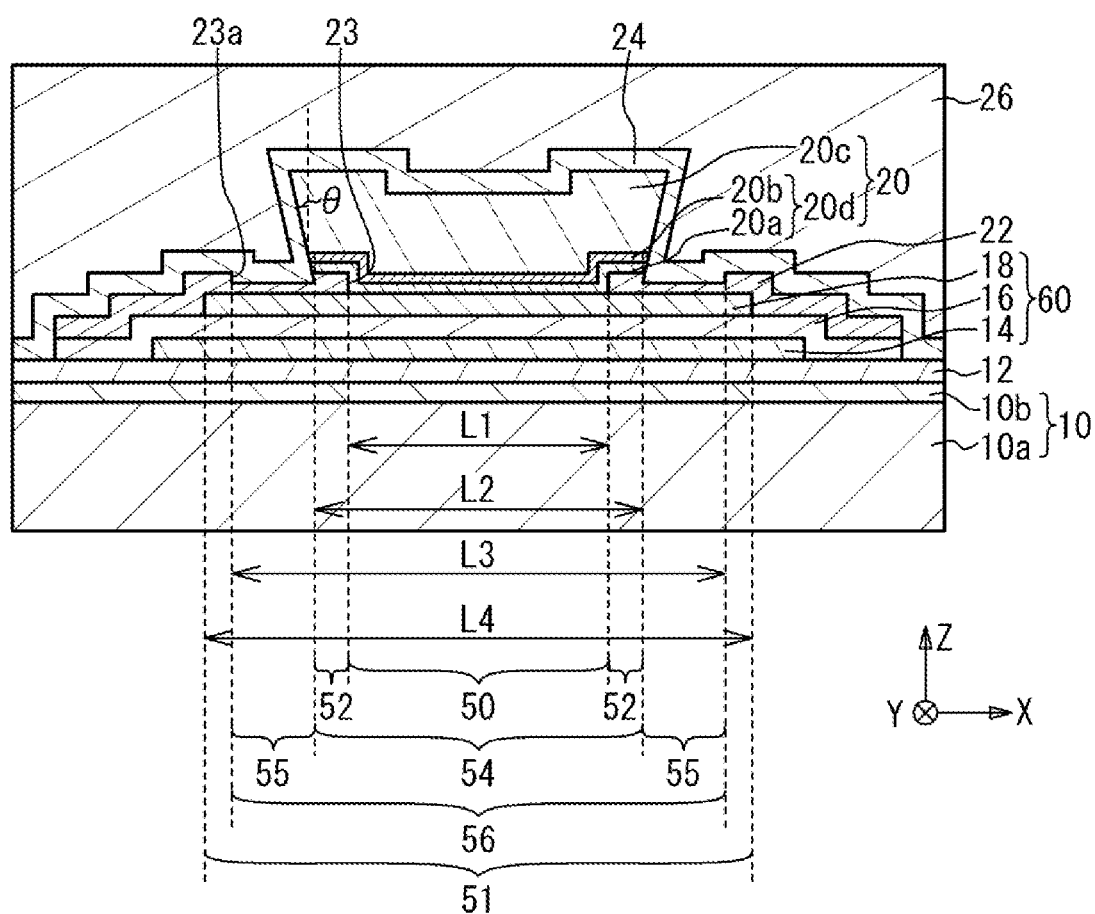
FIG. 18 is a cross-sectional view illustrating a capacitor according to modification 2 of the first embodiment.

FIG. 18 is a cross-sectional view of a capacitor according to modification 2 of the first embodiment. As illustrated in FIG. 18, the side surface of third electrode 20 is inclined with respect to the Z direction. The inclination angle of the side surface of third electrode 20 with respect to the Z direction is θ. The inclination angle θ is, for example, −30° to 30° with the positive side in the Z direction as 0°. Other configurations are the same as those of the first embodiment, and a description thereof is omitted. As in modification 2 of the first embodiment, even when the side surface of third electrode 20 is inclined, when organic insulator film 26 is not disposed between the lower surface of third electrode 20 and second electrode 18, it is possible to suppress the deterioration of the electrical characteristics caused by the stress of organic insulator film 26. When the side surface of third electrode 20 is inclined, the side surface of third electrode 20 may be the lower surface of third electrode 20. In such a case, organic insulator film 26 may not be disposed between second electrode 18 and a portion of the lower surface of third electrode 20 parallel to the upper surface of substrate 10 in the Z direction.

When third electrode 20 is used as a wiring, the thickness of third electrode 20 is increased. Third electrode 20 is thicker than second electrode 18, for example. The thickness of third electrode 20 is larger than the total thickness of first electrode 14, dielectric film 16 and second electrode 18, and is, for example, 1 µm or more. The method of forming thick third electrode 20 is generally an electrolytic plating method. Thus, a capacitor is manufactured as illustrated in FIGS. 3A to 10B of the first embodiment.

Modification 3 of First Embodiment

Figure 19A:
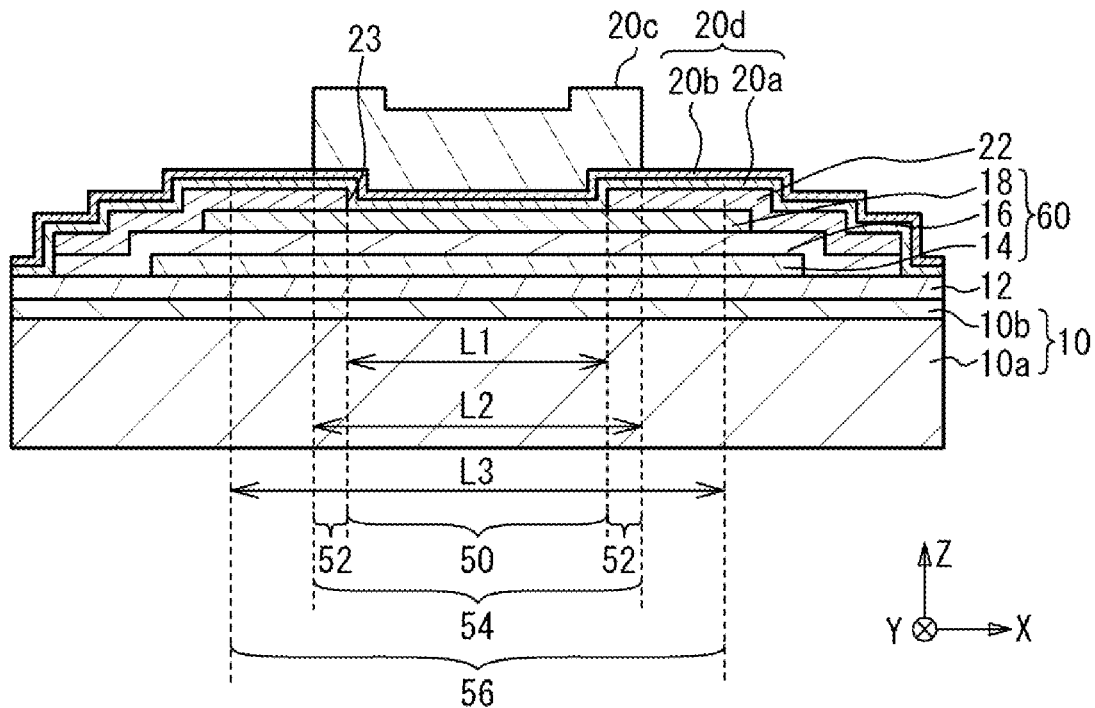
FIG. 19A is a cross-sectional view illustrating a method of manufacturing a capacitor according to modification 3 of the first embodiment.
Figure 19B:
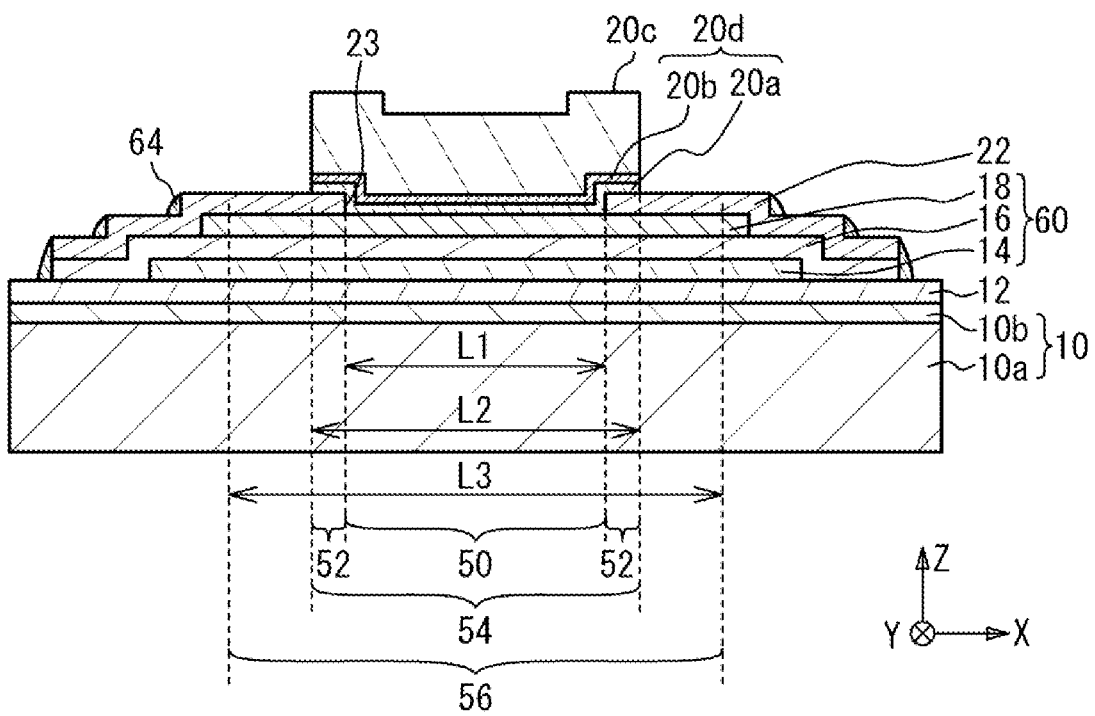
FIG. 19B is a cross-sectional view illustrating the method of manufacturing the capacitor according to modification 3 of the first embodiment.

In order to explain the reason why mask layer 42 is disposed in the first embodiment, modification 3 of the first embodiment will be described. FIGS. 19A and 19B are cross-sectional views illustrating a method of manufacturing a capacitor according to modification 3 of the first embodiment. As illustrated in FIG. 19A, the steps of FIGS. 3A to 6A of the first embodiment are performed, and mask layer 42 is not formed and seed layer 20d is formed in FIG. 6B. As in FIGS. 7B and 8A, plating layer 20c is formed. As in FIG. 8B, mask layer 44 is removed. In modification 3 of the first embodiment, mask layer 42 illustrated in FIG. 6B of the first embodiment is not formed. Therefore, seed layer 20d is in contact with inorganic insulator film 22. A level difference corresponding to the end portions of first electrode 14 and second electrode 18 is formed on the upper surface of inorganic insulator film 22. Seed layer 20d is also formed on the level difference of the upper surface of inorganic insulator film 22.

As illustrated in FIG. 19B, when seed layer 20d is etched using plating layer 20c as a mask, a seed layer 64 remains at the level difference on the upper surface of inorganic insulator film 22. Thereafter, inorganic insulator film 24 and organic insulator film 26 are formed in the same manner as FIG. 10A and FIG. 10B of the first embodiment. The other steps are the same as those of the first embodiment and will not be described.

In modification 3 of the first embodiment, remaining seed layer 64 may be peeled off in a subsequent step and cause a defect. In the first embodiment, since the upper surface of mask layer 42 is relatively flat as illustrated in FIG. 6B, a level difference is not formed on the upper surface of mask layer 42. Therefore, as illustrated in FIG. 9A, seed layer 20d does not remain on the level difference of the upper surface of inorganic insulator film 22. Even if a level difference is formed on the upper surface of mask layer 42 and seed layer 20d remains, remaining seed layer 20d can be removed by removing mask layer 42. In addition, by inclining the side surface of opening 43 of mask layer 42 so that the upper portion of opening 43 is larger than the lower portion thereof, seed layer 20d can be made less likely to remain on the side surface of mask layer 42.

In the first embodiment, as illustrated in FIGS. 3A to 4A, first electrode 14, dielectric film 16, and second electrode 18 are formed on substrate 10. As illustrated in FIG. 6B, mask layer 42 (first mask layer) having opening 43 (first opening) is formed on second electrode 18. As illustrated in FIG. 7A, seed layer 20d is formed on the inner surface of opening 43 and on mask layer 42. As illustrated in FIG. 7B, mask layer 44 (second mask layer) having opening 45 (second opening) which is included in opening 43 and has an opening area smaller than that of opening 43 in plan view is formed on seed layer 20d. As illustrated in FIG. 8A, plating layer 20c is formed in opening 45. As illustrated in FIG. 8B, mask layer 44 is removed. As illustrated in FIG. 9A, by removing seed layer 20d using plating layer 20c as a mask, third electrode 20 including seed layer 20d and plating layer 20c is formed. As illustrated in FIG. 10B, organic insulator film 26 is formed on substrate 10 so as to cover third electrode 20. As described above, since third electrode 20 can be formed using the electrolytic plating method, the thickness of third electrode 20 can be increased. In addition, when organic insulator film 26 is formed, organic insulator film 26 is not formed between the lower surface of third electrode 20 and second electrode 18 in the Z direction. As a result, it is possible to suppress deterioration of electrical characteristics of the capacitor caused by stress 62 of organic insulator film 26. Furthermore, defects caused by seed layer 64 remaining in the level difference on the upper surface of inorganic insulator film 22 as in modification 3 of the first embodiment can be suppressed.

Before mask layer 42 is formed, inorganic insulator film 22 having opening 23 (third opening) is formed on second electrode 18 as illustrated in FIGS. 4B to 6A. As illustrated in FIG. 6B, mask layer 42 including opening 23 and having opening 43 having an opening area equal to or larger than the opening area of opening 23 is formed. By providing inorganic insulator film 22 in this manner, it is possible to prevent the upper surface of second electrode 18 in region 55 from being etched when seed layer 20d is etched in FIG. 9A.

In the capacitor manufactured using the manufacturing method of the first embodiment, as illustrated in FIG. 1, inorganic insulator film 22 having opening 23 in region 50 is disposed on second electrode 18. Region 50 of the lower surface of third electrode 20 is in contact with second electrode 18 through opening 23, and region 52 of the lower surface of third electrode 20 surrounding region 50 is in contact with inorganic insulator film 22 outside opening 23.

Since third electrode 20 is formed using electrolytic plating, third electrode 20 has a structure including seed layer 20d disposed on second electrode 18 and plating layer 20c disposed on seed layer 20d. In such a structure, inorganic insulator film 22 may be disposed so that the upper surface of second electrode 18 is not etched off when seed layer 20d is removed.

As illustrated in FIG. 9A, when seed layer 20d is etched, recess 23a is formed in region 55 (third region) surrounding third electrode 20 on the upper surface of inorganic insulator film 22. When the outer periphery of region 55 is located outside the outer periphery of second electrode 18, seed layer 64 remains at the level difference on the upper surface of inorganic insulator film 22 located at the end of second electrode 18. Therefore, the outer periphery of region 55 may be located inside the outer periphery of second electrode 18.

Seed layer 20d includes adhesive layer 20a and low-resistance layer 20b having resistivity lower than that of adhesive layer 20a. Accordingly, third electrode 20 includes adhesive layer 20a (first layer) disposed on second electrode 18, low-resistance layer 20b disposed on adhesive layer 20a and having a resistivity lower than resistivities of adhesive layer 20a (second layer), and plating layer 20c (second layer). In this structure, organic insulator film 26 is not disposed between adhesive layer 20a and second electrode 18 in the Z direction. As a result, it is possible to suppress deterioration of electrical characteristics of the capacitor caused by stress 62 of organic insulator film 26.

Modification 4 of First Embodiment

Figure 20A:
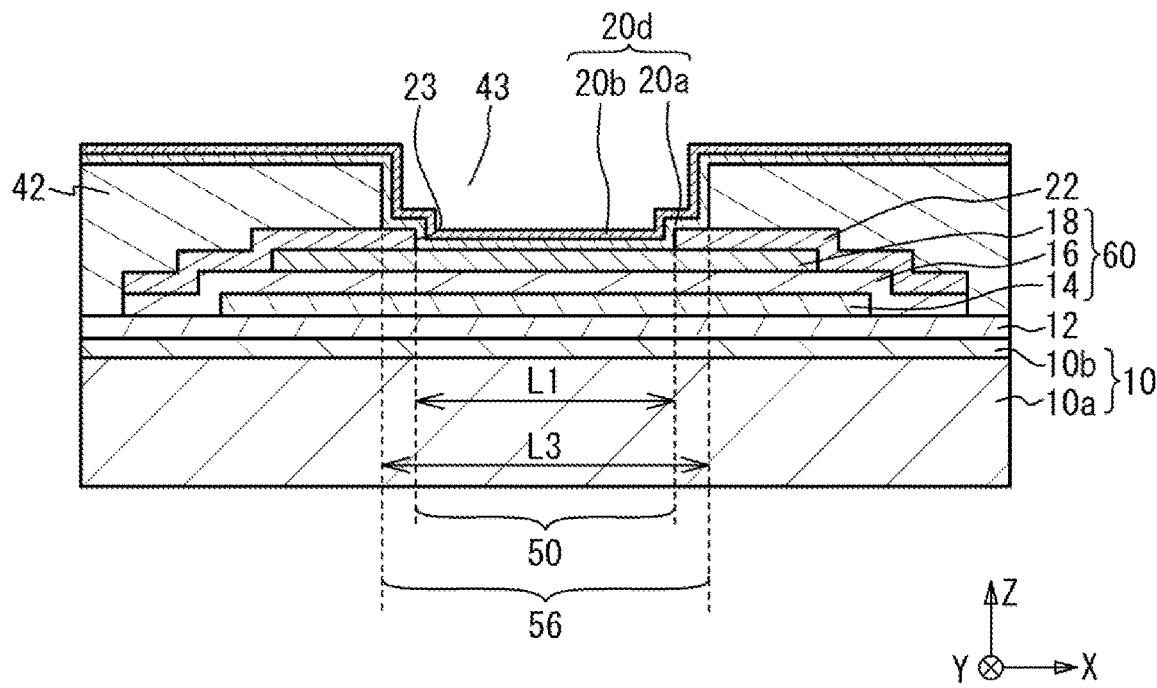
FIG. 20A is a cross-sectional view illustrating a method of manufacturing a capacitor according to modification 4 of the first embodiment.

FIG. 20A to FIG. 21B are cross-sectional views illustrating a method of manufacturing a capacitor according to modification 4 of the first embodiment. As illustrated in FIG. 20A, seed layer 20d is formed on mask layer 42 having opening 43 and in opening 43. As compared with FIG. 7A of the first embodiment, opening 43 of mask layer 42 has a smaller width L3 along the X direction. As illustrated in FIG. 20B, opening 45 of mask layer 44 formed on seed layer 20d has width L2 along the X direction slightly smaller than width L3 along the X direction of opening 43. Plating layer 20c is formed in opening 43. Since widths L3 and L2 are substantially equal to each other, plating layer 20c is formed on seed layer 20d formed on the side surface of opening 43 in the peripheral portion of opening 45.

Figure 21A:
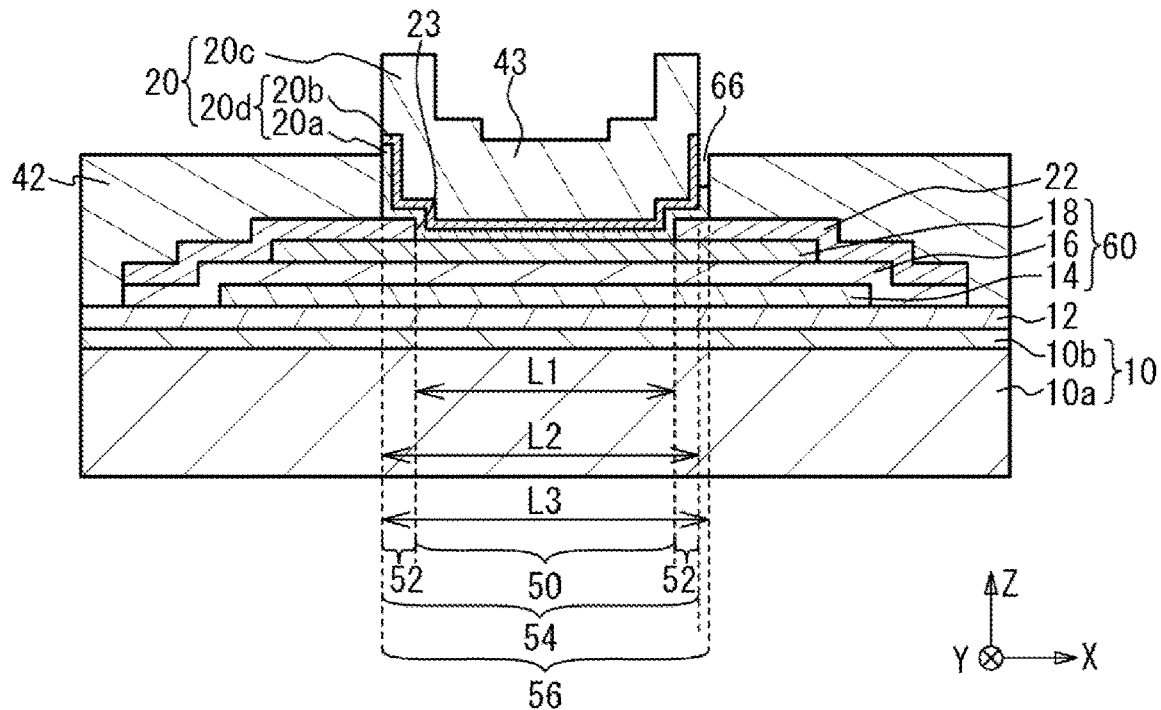
FIG. 21A is a cross-sectional view illustrating the method of manufacturing the capacitor according to modification 4 of the first embodiment.
Figure 21B:
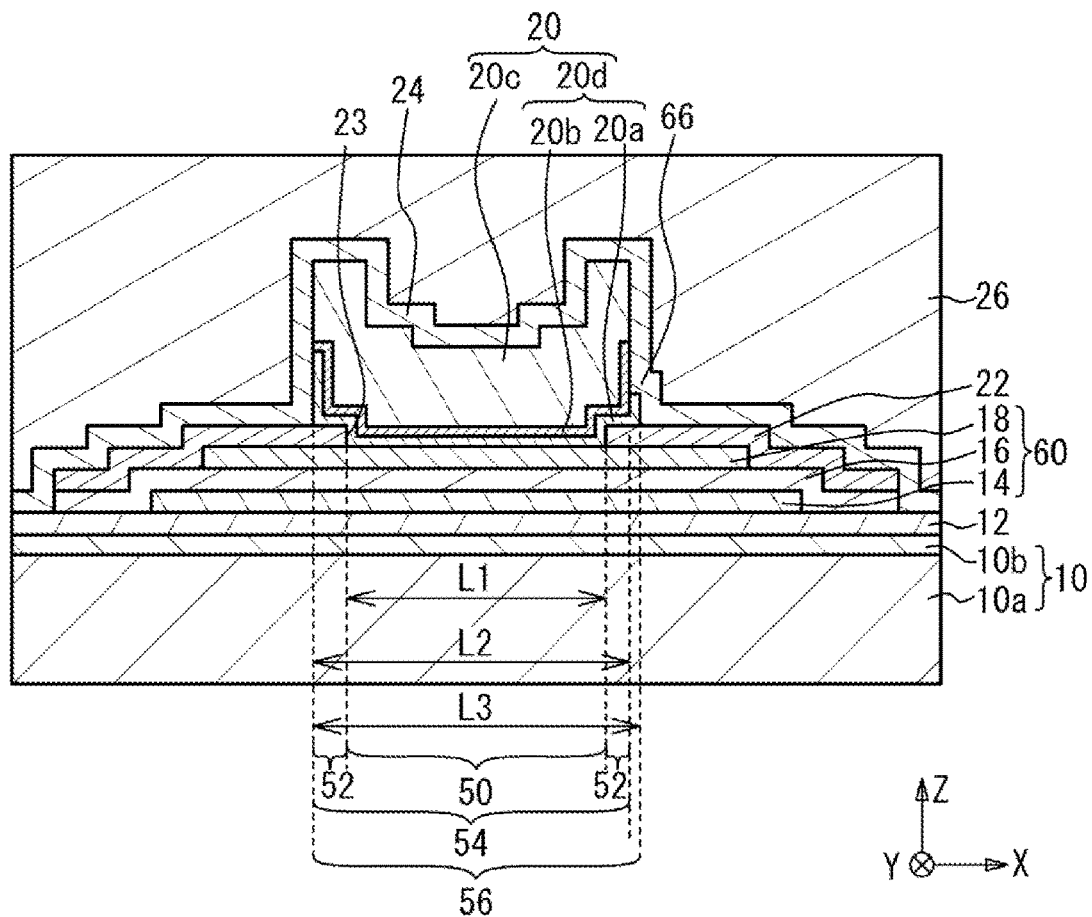
FIG. 21B is a cross-sectional view illustrating the method of manufacturing the capacitor according to modification 4 of the first embodiment.

As illustrated in FIG. 21A, after mask layer 44 is removed, seed layer 20d is etched using plating layer 20c as a mask. At this time, at least a part of seed layer 20d formed on the side surface of opening 43 is etched and a level difference 66 is generated in seed layer 20d. As illustrated in FIG. 21B, inorganic insulator film 24 and organic insulator film 26 are formed. Thus, the capacitor according to modification 4 of the first embodiment is manufactured. The other steps are the same as those of the first embodiment, and the description thereof is omitted.

Figure 20B:
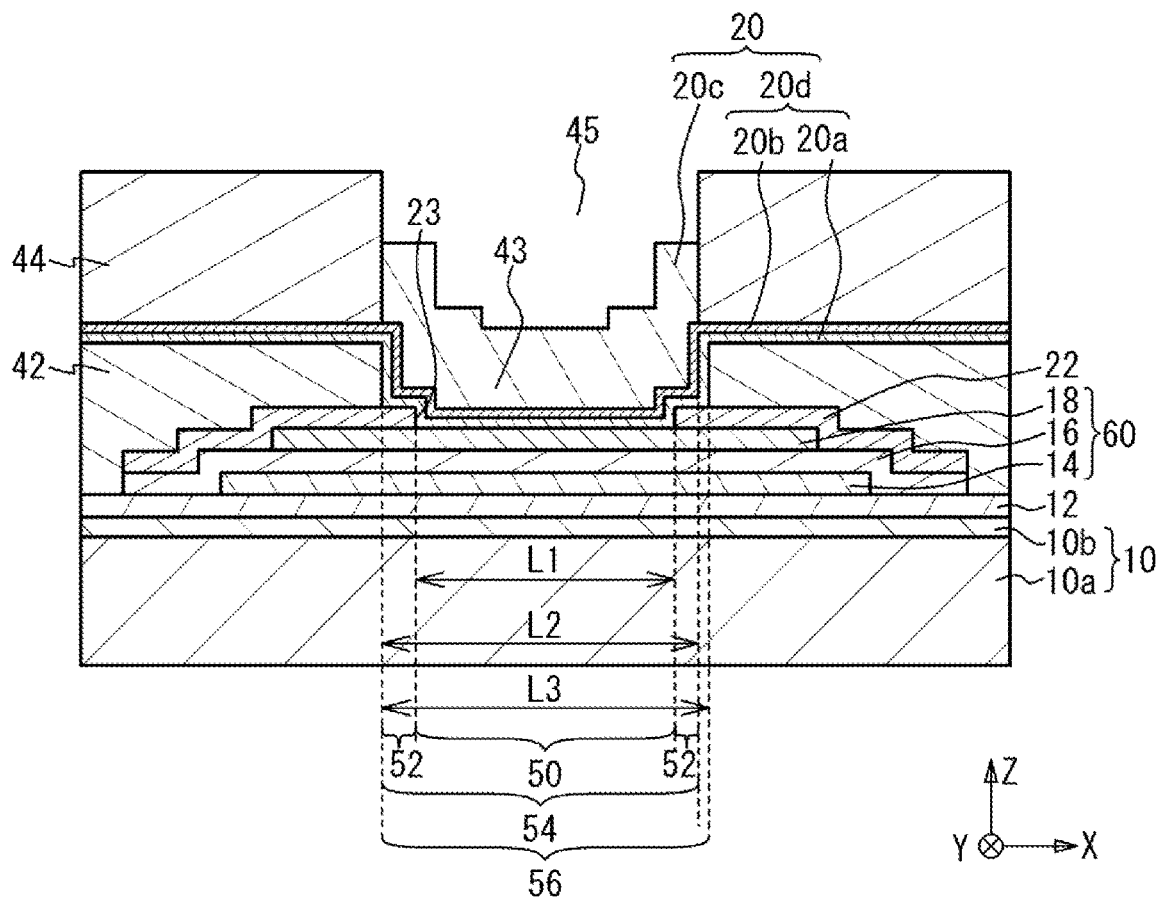
FIG. 20B is a cross-sectional view illustrating the method of manufacturing the capacitor according to modification 4 of the first embodiment.

In FIG. 20B, organic insulator film 26 is not disposed between the lower surface of third electrode 20 and second electrode 18 when opening 43 and opening 45 coincide with each other even if width L3 of opening 43 along the X direction is the same as width L2 of opening 45 along the X direction. However, in consideration of misalignment between opening 45 and opening 43, width L2 may be smaller than width L3. When the difference between widths L2 and L3 is small, level difference 66 is formed in seed layer 20d as in modification 4 of the first embodiment (FIG. 21A and FIG. 21B). In order to suppress the formation of level difference 66, width L2 of opening 45 in the X direction may be smaller than width L3 of opening 43 in the X direction by at least twice the thicknesses of seed layers 20d, and may be smaller by at least five times. In consideration of the alignment accuracy between openings 45 and 43, width L2 may be larger than width L3 by 1 μm or more, and may be by 2 μm or more.

Modification 5 of First Embodiment

Figure 22A:
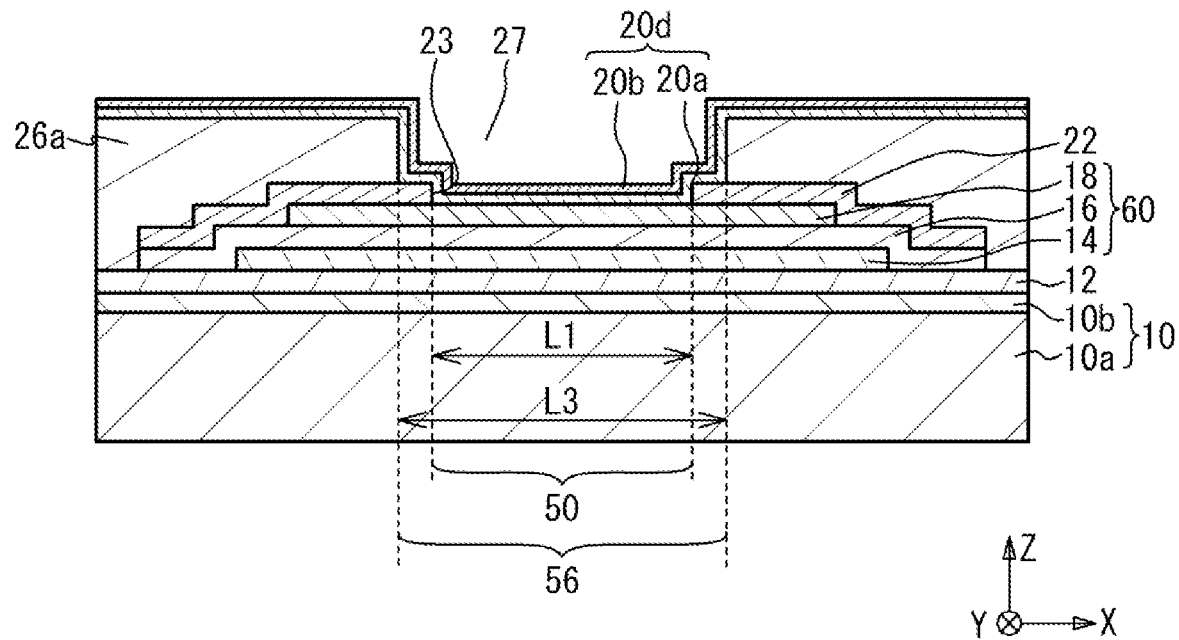
FIG. 22A is a cross-sectional view illustrating a method of manufacturing a capacitor according to modification 5 of the first embodiment.
Figure 22B:
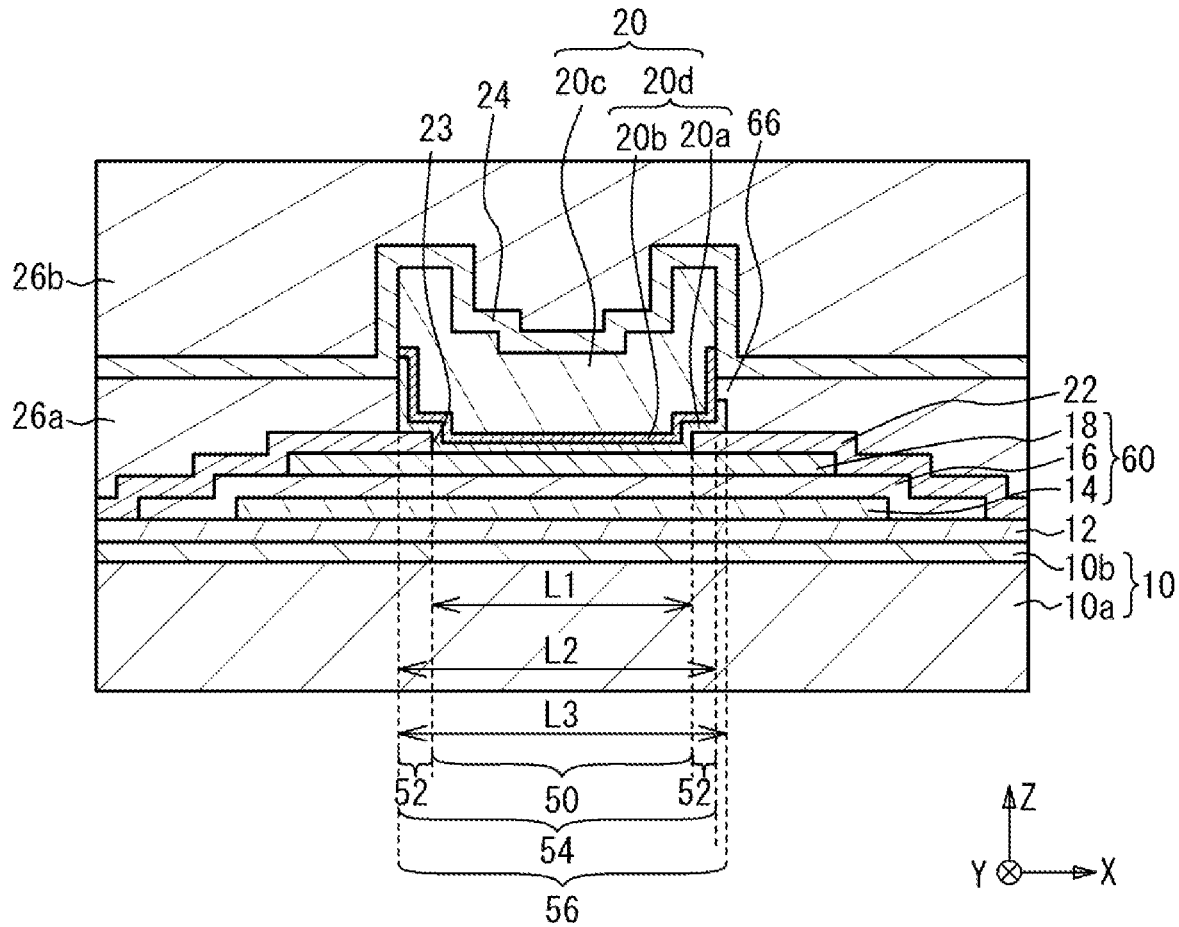
FIG. 22B is a cross-sectional view illustrating the method of manufacturing the capacitor according to modification 5 of the first embodiment.

FIG. 22A and FIG. 22B are cross-sectional views illustrating a method of manufacturing a capacitor according to modification 5 of the first embodiment. As illustrated in FIG. 22A, organic insulator film 26a having opening 27 is disposed instead of mask layer 42 in FIG. 20A of modification 4 of the first embodiment. Opening 27 is provided in region 56 along the X direction, and the width of opening 27 along the X direction is L3. As illustrated in FIG. 22B, third electrode 20 is formed in the same manner as in modification 4 of the first embodiment, and inorganic insulator film 24 and organic insulator film 26b are formed on organic insulator film 26a and third electrode 20. The other steps are the same as those of the first embodiment and modification 4 of the first embodiment, and the description thereof is omitted.

As in modification 5 of the first embodiment, organic insulator film 26a may be used instead of mask layer 42, and organic insulator film 26a may remain without being removed.

Modification 6 of First Embodiment

Figure 23A:
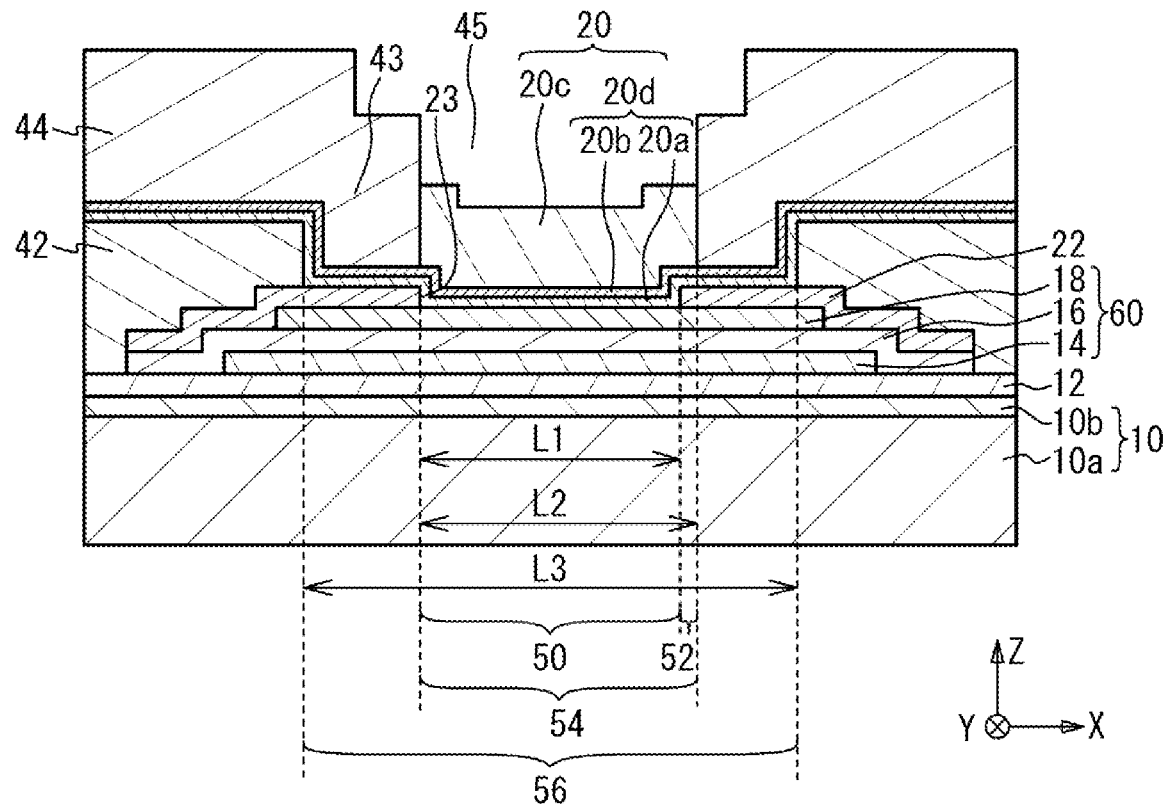
FIG. 23A is a cross-sectional view illustrating a method of manufacturing a capacitor according to modification 6 of the first embodiment.
Figure 23B:
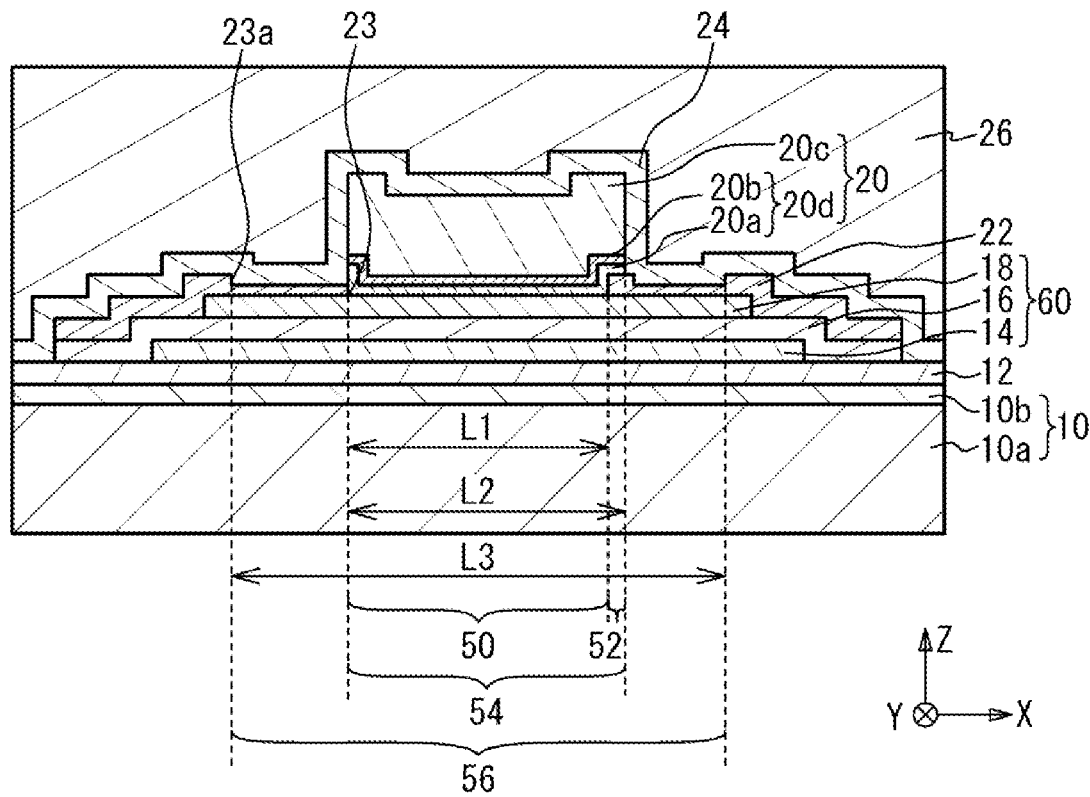
FIG. 23B is a cross-sectional view illustrating the method of manufacturing the capacitor according to modification 6 of the first embodiment.

FIG. 23A and FIG. 23B are cross-sectional views illustrating a method of manufacturing a capacitor according to modification 6 of the first embodiment. As illustrated in FIG. 23A, width L2 of opening 45 along the X direction is slightly wider than width L1 of opening 23 along the X direction. The negative side end of opening 45 in the X direction substantially coincides with the negative side end of opening 23 in the X direction. The positive side end of opening 45 in the X direction is located outside the positive side end of opening 23 in the X direction. In FIG. 23A, region 52 exists only in the positive side of region 50 in the X direction. As illustrated in FIG. 23B, the capacitor according to modification 6 of the first embodiment is manufactured by performing the steps of FIG. 8B to FIG. 10B of the first embodiment. The other steps are the same as those of the first embodiment, and the description thereof is omitted.

In FIG. 23A, width L2 may be the same as width L1. However, when there is a misalignment between opening 45 and opening 23, there is a region where opening 23 is located outside opening 45. In this case, as illustrated in FIG. 9A, when seed layer 20d is etched by using plating layer 20c as a mask, the upper surface of second electrode 18 is etched. Therefore, width L2 may be larger than width L1. From the viewpoint of the alignment accuracy between openings 45 and 23, width L1 may be smaller than width L2 by 1 μm or more, and may be smaller by 2 μm or more.

Modification 7 of First Embodiment

Figure 24A:
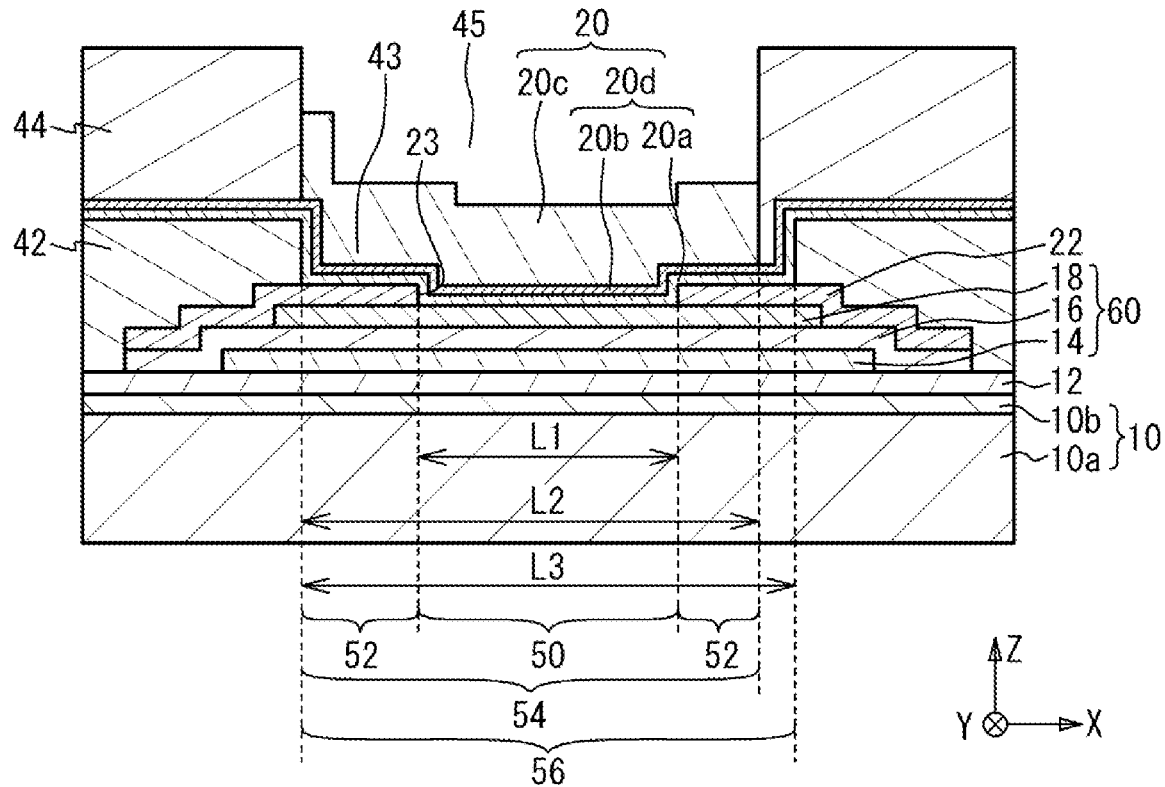
FIG. 24A is a cross-sectional view illustrating the method of manufacturing the capacitor according to modification 7 of the first embodiment.
Figure 24B:
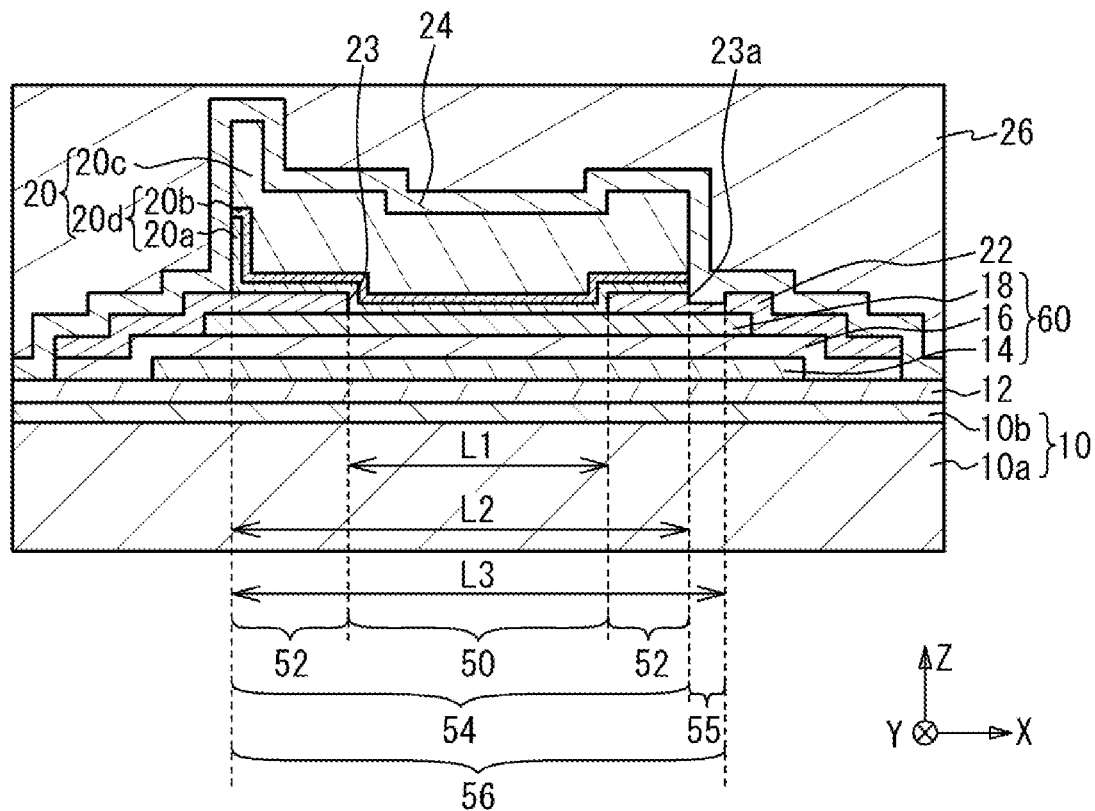
FIG. 24B is a cross-sectional view illustrating the method of manufacturing the capacitor according to modification 7 of the first embodiment.

FIG. 24A and FIG. 24B are cross-sectional views illustrating a method of manufacturing a capacitor according to modification 7 of the first embodiment. As illustrated in FIG. 24A, width L2 of opening 45 along the X direction is slightly smaller than width L3 of opening 43 along the X direction. The negative side end of opening 45 in the X direction substantially coincides with the negative side end of opening 43 in the X direction. The positive side end of opening 45 in the X direction is located inside the positive side end of opening 43 in the X direction. As illustrated in FIG. 24B, the capacitor according to modification 7 of the first embodiment is manufactured by performing the steps of FIG. 8B to FIG. 10B of the first embodiment. In FIG. 24B, region 55 exists only on the positive side of region 54 in the X direction. The other steps are the same as those of the first embodiment, and the description thereof is omitted.

In FIG. 24A, width L2 may be the same as width L3. However, when there is a misalignment between opening 45 and opening 43, there is a region where opening 43 is located outside opening 45. In this case, organic insulator film 26 is formed between the lower surface of third electrode 20 and second electrode 18. Therefore, width L3 may be larger than width L2. From the viewpoint of the alignment accuracy of openings 45 and 43, width L3 may be larger than width L2 by 1 µm or more, and may be by 2 µm or more.

In the first embodiment and its modification, second electrode 18 may be formed of two layers as PTL 1. As a result, it is possible to suppress a decrease in the withstand voltage of the capacitor due to splash formed when second electrode 18 is formed using a vacuum evaporation method.

It should be understood that the embodiments disclosed herein are illustrative in all respects and are not restrictive. The scope of the present disclosure is defined by the appended claims rather than by the foregoing description, and is intended to include all modifications within the meaning and scope equivalent to the appended claims.

What is claimed is:

1. A capacitor comprising:
   a substrate;
   a first electrode disposed on the substrate;
   a dielectric film disposed on the first electrode;
   a second electrode disposed on the dielectric film;
   a first inorganic insulator film disposed on the second electrode and having an opening,
   a third electrode in contact with the second electrode in a first region of at least a portion of a lower surface of the third electrode through the opening, in a second region of the lower surface of the third electrode, the second region surrounding the first region, is in contact with the first inorganic insulator film outside the opening,
   a second inorganic insulator film disposed on contact with the dielectric film, the first inorganic insulator film and the third electrode; and
   an organic insulator film covering an upper portion of the dielectric film, an upper portion of the second electrode, and the third electrode,
   wherein the organic insulator film covering on contact with the second inorganic insulator film,
   wherein in a normal direction normal to an upper surface of the substrate, the organic insulator film is not disposed between the lower surface of the third electrode and the second electrode.

2. The capacitor according to claim 1, wherein the third electrode includes a seed layer disposed on the second electrode and a plating layer disposed on the seed layer.

3. The capacitor according to claim 2, wherein a recess is provided in a third region of an upper surface of the first inorganic insulator film, the third region surrounding the third electrode.

4. The capacitor according to claim 1, wherein in the normal direction, the organic insulator film is not disposed between a portion of the lower surface of the third electrode, the portion being parallel to the upper surface of the substrate, and the second electrode.

5. The capacitor according to claim 1, wherein the third electrode includes a first layer disposed on the second electrode and a second layer disposed on the first layer and having a resistivity lower than a resistivity of the first layer, and
   in the normal direction, the organic insulator film is not disposed between the first layer and the second electrode.

6. A method of manufacturing a capacitor, the method comprising:
   forming a first electrode on a substrate;
      forming a dielectric film on the first electrode;
      forming a second electrode on the dielectric film;
      forming, on the second electrode, a first mask layer being a first inorganic insulator film having a first opening;
      forming a seed layer on an inner surface of the first opening and on the first mask layer;
      forming, on the seed layer, a second mask layer that has a second opening included in the first opening and having an opening area larger than an opening area of the first opening in plan view;
      forming a plating layer in the second opening;
      removing the second mask layer;
      removing the seed layer using the plating layer as a mask to form a third electrode including the seed layer and the plating layer;
      forming, on the dielectric film, the first inorganic insulator film and the third electrode, a second inorganic insulator film; and
      forming an organic insulator film on the substrate so as to covering on contact with the second inorganic insulator film.

7. The method of manufacturing the capacitor according to claim 6, wherein the forming the organic insulator film includes forming the organic insulator film such that the organic insulator film is not formed between a lower surface of the third electrode and the second electrode in a normal direction normal to an upper surface of the substrate.

8. The method of manufacturing the capacitor according to claim 6, the method comprising:
   wherein the forming the second mask layer includes forming the second mask layer that has the second opening including a third opening and having an opening area with a size equal to or larger than an opening area of the third opening in plan view.

* * * * *